(12) United States Patent
Jeong

(10) Patent No.: US 11,327,109 B2
(45) Date of Patent: May 10, 2022

(54) STACKED SEMICONDUCTOR DEVICE AND TEST METHOD THEREOF

(71) Applicant: SK hynix Inc., Gyeonggi-do (KR)

(72) Inventor: Young-Mok Jeong, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 111 days.

(21) Appl. No.: 16/432,284

(22) Filed: Jun. 5, 2019

(65) Prior Publication Data
US 2020/0158776 A1    May 21, 2020

(30) Foreign Application Priority Data

Nov. 15, 2018   (KR) .................... 10-2018-0140555

(51) Int. Cl.
*G01R 31/28*   (2006.01)
*H01L 25/065*   (2006.01)
*H01L 25/18*   (2006.01)

(52) U.S. Cl.
CPC ..... *G01R 31/2853* (2013.01); *G01R 31/2896* (2013.01); *H01L 25/0657* (2013.01); *H01L 25/18* (2013.01); *H01L 2225/06541* (2013.01)

(58) Field of Classification Search
CPC . G01B 5/00; G01B 7/00; G01B 17/00; G01B 21/00; G01D 3/00; G01D 5/00; G01H 9/00; G01H 11/00; G01J 1/00; G01J 3/00; G01J 5/00; G01K 1/00; G01K 3/00; G01K 5/00; G01K 7/00; G01K 11/00; G01K 15/00; G01K 2219/00; G01L 1/00; G01L 5/00; G01L 9/00; G01L 21/00; G01M 3/00; G01M 5/00; G01M 13/00; G01M 15/00; G01N 2291/00; G01N 3/00; G01N 5/00; G01N 9/00; G01N 17/00;
(Continued)

(56) References Cited

U.S. PATENT DOCUMENTS 8,760,181 B2 * 6/2014 Byeon ................ G11C 11/4076
                                                324/750.15
9,322,868 B2 * 4/2016 Shin ................... G01R 31/2607
(Continued)

FOREIGN PATENT DOCUMENTS

| KR | 10-2011-0046894 | 5/2011 |
|----|------------------|--------|
| KR | 10-2014-0080894 | 7/2014 |
| KR | 10-1633678       | 6/2016 |

*Primary Examiner* — Lee E Rodak
*Assistant Examiner* — Joseph O Nyamogo
(74) *Attorney, Agent, or Firm* — IP & T Group LLP

(57) ABSTRACT

A stacked semiconductor device includes: a plurality of semiconductor chips that are stacked in a vertical direction, wherein each of the semiconductor chips includes: a plurality of first through-electrodes; a plurality of second through-electrodes positioned adjacent to the first through-electrodes; a first voltage driving circuit suitable for providing the first through-electrodes with a test voltage or a ground voltage based on a first driving control signal; a second voltage driving circuit suitable for providing the second through-electrodes with the test voltage or the ground voltage based on a second driving control signal; and a failure detection circuit suitable for generating a failure signal based on a plurality of first detection signals received through the first through-electrodes and a plurality of second detection signals received through the second through-electrodes.

15 Claims, 13 Drawing Sheets

(58) Field of Classification Search
CPC ........ G01N 21/00; G01N 22/00; G01N 23/00; G01N 24/00; G01N 25/00; G01N 27/00; G01N 29/00; G01N 31/00; G01N 33/00; G01N 2021/00; G01P 3/00; G01Q 10/00; G01Q 60/00; G01Q 70/00; G01R 1/00; G01R 3/00; G01R 15/00; G01R 19/00; G01R 22/00; G01R 27/00; G01R 29/00; G01R 31/00; G01R 33/00; G01R 35/00; G01R 31/2853; G01R 31/2896; G01R 31/2856; G01S 5/00; G01S 13/00; G01V 3/00; G02B 1/00; G02B 6/00; G02B 2006/00; G02F 1/00; G02F 2/00; G02F 2001/00; G02F 2201/00; G02F 2202/00; G02F 2203/00; G03G 15/00; G03H 1/00; G03H 2001/00; G03H 2226/00; G04F 5/00; G05D 23/00; G05F 3/00; G06F 1/00; G06F 3/00; G06F 17/00; G06K 7/00; G06K 9/00; G06N 3/00; G06N 10/00; G06N 20/00; G06Q 10/00; G06T 5/00; G06T 7/00; G06T 11/00; G06T 2207/00; G06T 2211/00; G07C 9/00; G08B 17/00; G08B 21/00; G08B 29/00; G09G 3/00; G09G 2300/00; G09G 2320/00; G09G 2330/00; G09G 2360/00; G09G 2370/00; G11B 9/00; G11C 11/00; G11C 13/00; G11C 29/00; G11C 29/006; G11C 29/12005; G11C 29/56004; G11C 5/06; G21K 1/00; G16H 30/00; G16H 50/00; H01B 3/00; H01F 1/00; H01F 17/00; H01F 27/00; H01F 2017/00; H01F 2021/00; H01L 29/00; H01L 21/00; H01L 22/00; H01L 23/00; H01L 24/00; H01L 25/00; H01L 27/00; H01L 31/00; H01L 33/00; H01L 41/00; H01L 43/00; H01L 45/00; H01L 49/00; H01L 51/00; H01L 2223/00; H01L 2224/00; H01L 2225/00; H01L 2251/00; H01L 2924/00; H01L 2933/00; H01L 25/0657; H01L 25/18; H01L 2225/06541; H01L 2225/06596; H01L 2225/06513; H01L 2924/15192; H01L 2224/13025; H01L 2224/16145; H01L 2224/16225; H01L 2924/15311; H01L 25/04; H01L 23/481; H01L 22/10; H01H 1/00; H01H 2001/00; H01H 2009/00; H01P 1/00; H01P 3/00; H01P 7/00; H01P 11/00; H01Q 1/00; H01Q 3/00; H01Q 9/00; H01Q 15/00; H01Q 17/00; H01Q 21/00; H01Q 25/00; H01R 4/00; H01R 9/00; H01R 12/00; H01S 3/00; H02J 1/00; H02M 1/00; H02M 3/00; H02M 7/00; H02M 2001/00; H02M 2003/00; H02P 5/00; H03B 5/00; H03B 17/00; H03B 19/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00; H03J 2200/00; H03K 3/00; H03K 17/00; H03K 19/00; H03L 7/00; H03L 2207/00; H03M 1/00; H04B 10/00; H04B 17/00; H04L 27/00; H04N 5/00; H04N 7/00; H04R 3/00; H04R 29/00; H04W 24/00; H05B 33/00; H05B 45/00; H05B 47/10; H05H 3/00; H05K 1/00; H05K 2201/00; H05K 3/00; H05K 7/00

See application file for complete search history.

(56) References Cited

U.S. PATENT DOCUMENTS

| | | | |
|---|---|---|---|
| 10,001,525 B2* | 6/2018 | Kang | G01R 31/3177 |
| 10,074,579 B1* | 9/2018 | Kim | H01L 25/0652 |
| 10,262,911 B1* | 4/2019 | Gong | H01L 25/0652 |
| 2011/0080185 A1* | 4/2011 | Wu | G01R 31/2601 |
| | | | 324/750.3 |
| 2012/0104388 A1* | 5/2012 | Choi | H01L 25/0657 |
| | | | 257/48 |
| 2019/0198089 A1* | 6/2019 | Kim | G11C 7/1006 |

* cited by examiner

FIG. 10

| CASE | | INPUT | | | | OUTPUT(SID_TOP="H") | | | | | STATUS |
|---|---|---|---|---|---|---|---|---|---|---|---|
| | | TM_PT | TM_NT | TM_PB | TM_NB | TM_OS_PRE | TM_OS_P1 | TM_OS_N1 | TM_OS_P2 | TM_OS_N2 | |
| NORMAL | | 0 | 0 | 0 | 0 | 0 | 0 | 0 | 0 | 0 | DEFAULT:FLOATING |
| TM | 1 | 1 | 0 | 1 | 0 | 1 | 1 | 0 | 1 | 0 | ALL HIGH CHARGE |
| | 2 | 0 | 1 | 0 | 1 | 1 | 0 | 1 | 0 | 1 | ALL LOW CHARGE |
| | 3 | 1 | 0 | 0 | 0 | 1 | 1 | 0 | 0 | 0 | TRUE ONLY HIGH CHARGE |
| | 4 | 0 | 1 | 0 | 0 | 1 | 0 | 1 | 0 | 0 | TRUE ONLY LOW CHARGE |
| | 5 | 0 | 0 | 1 | 0 | 1 | 0 | 0 | 1 | 0 | BAR ONLY HIGH CHARGE |
| | 6 | 0 | 0 | 0 | 1 | 1 | 0 | 0 | 0 | 1 | BAR ONLY LOW CHARGE |

STACKED SEMICONDUCTOR DEVICE AND TEST METHOD THEREOF

CROSS-REFERENCE TO RELATED APPLICATIONS

The present application claims priority of Korean Patent Application No. 10-2018-0140555, filed on Nov. 15, 2018, which is incorporated herein by reference in its entirety.

BACKGROUND

1. Field

Exemplary embodiments of the present invention relate to semiconductor designing technology, and more particularly, to a method for testing a stacked semiconductor device.

2. Description of the Related Art

As semiconductor technology makes dramatic progress, packaging technology for semiconductor integrated devices is also required to have a high integration degree and high performance. Therefore, researchers and the industry are developing various technologies related to a three-dimensional structure in which a plurality of semiconductor chips are vertically stacked rather than a two-dimensional structure in which semiconductor chips including integrated circuits formed thereon are horizontally arranged on a printed circuit board (PCB) by using wires or bumps.

Such a three-dimensional structure may be realized in a form of a stacked semiconductor device in which a plurality of semiconductor chips are vertically stacked. The semiconductor chips mounted in the vertical direction may be electrically connected to each other through a through silicon via (TSV) (or through-electrode) and mounted on a substrate for a semiconductor package.

Meanwhile, various defects may occur in a through-electrode. Such defects may include voids, bump contact failures, and cracking of the through-electrode itself. The voids may occur because the through-electrode is not completely filled with a conductive material. The bump contact failures may occur when a chip is bent or a bump material migrates. Since the through-electrode performs a function of electrically connecting a plurality of chips, if a failure occurs and the through-electrode is interrupted in the middle (i.e., open failure) or a short failure occurs between a particular voltage terminal and the through-electrode, the through-electrode may not function normally. Therefore, it may be necessary to detect whether the through-electrode is defective or not through a test.

SUMMARY

Embodiments of the present invention are directed to a semiconductor device capable of detecting whether a plurality of through-electrodes are defective or not at one time in a stacked semiconductor device.

Embodiments of the present invention are directed to a semiconductor device capable of detecting not only the defectiveness of through-electrodes that are coupled in a vertical direction but also the defectiveness of neighboring through-electrodes in a stacked semiconductor device.

In accordance with an embodiment of the present invention, a stacked semiconductor device includes: a plurality of semiconductor chips that are stacked in a vertical direction, wherein each of the semiconductor chips includes: a plurality of first through-electrodes; a plurality of second through-electrodes positioned adjacent to the first through-electrodes; a first voltage driving circuit suitable for providing the first through-electrodes with a test voltage or a ground voltage based on a first driving control signal; a second voltage driving circuit suitable for providing the second through-electrodes with the is test voltage or the ground voltage based on a second driving control signal; and a failure detection circuit suitable for generating a failure signal based on a plurality of first detection signals received through the first through-electrodes and a plurality of second detection signals received through the second through-electrodes.

In accordance with another embodiment of the present invention, a stacked semiconductor device includes: a plurality of semiconductor chips that are stacked in a vertical direction, wherein each of the semiconductor chips includes: a plurality of first through-electrodes; a plurality of second through-electrodes positioned adjacent to the first through-electrodes; a voltage driving circuit suitable for applying a power source voltage to the first through-electrodes while applying a ground voltage to the second through-electrodes, applying the power source voltage to the second through-electrodes while applying the ground voltage to the first through-electrodes; and a failure detection circuit suitable for generating a failure signal informing a shortage between the first through-electrodes and the second through-electrodes based on first detection signals received through the first through-electrodes and second detection signals received through the second through-electrodes.

In accordance with yet another embodiment of the present invention, a method for testing a stacked semiconductor device includes: providing a plurality of semiconductor chips stacked in a vertical direction, each of the semiconductor chips including a plurality of first through-electrodes and a plurality of second through-electrodes positioned adjacent to the first through-electrodes; applying a ground voltage to the first through-electrodes and the second through-electrodes; generating a first failure signal based on first detection signals received through the first through-electrodes and second detection signals received through the second through-electrodes; applying a test voltage to the first through-electrodes while applying the ground voltage to the second through-electrodes; generating a second failure signal based on the first detection signals and the second detection signals; applying the test voltage to the first through-electrodes and the second through-electrodes; and generating a third failure signal based on the first detection signals and the second detection signals.

The first through-electrodes may include through-electrodes positioned at odd-numbered rows and odd-numbered columns, and through-electrodes positioned at even-numbered rows and even-numbered columns, and the second through-electrodes may include through-electrodes positioned in the odd-numbered rows and the even-numbered columns, and through-electrodes positioned in the even-numbered rows and the odd-numbered columns. The generating of the first failure signal may include: generating a first sum signal by detecting whether the first detection signals have the same logic level or not; generating a second sum signal by detecting whether the second detection signals have the same logic level or not; and generating the failure signal by performing a logic OR operation onto the first sum signal and the second sum signal. The method may further include detecting a short failure between a terminal for a power source voltage and through-electrodes or an open failure between the through-electrodes coupled in the vertical direction, based on the first failure signal. The method may further include detecting a short failure between the first through-electrodes and the second through-electrodes based on the second failure signal. The method may further include detecting a short failure between a terminal for a ground voltage and through-electrodes or an open failure between the through-electrodes coupled in the vertical direction, based on the third failure signal.

In accordance with another embodiment of the present invention, a stacked semiconductor device includes: a first chip; a second chip stacked over the first chip; and a plurality of through-electrodes coupling between the first chip and the second chip, the plurality of through-electrodes including a first group of through-electrodes positioned at first areas of the first and second chips, and a second group of through-electrodes positioned at second areas of the first and second chips, the second areas adjacent to the first areas; each of the first and second chips includes: a first voltage driving circuit suitable for providing the first group of through-electrodes with a test voltage or a ground voltage; a second voltage driving circuit suitable for providing the second group of through-electrodes with the test voltage or the ground voltage; and a failure detection circuit suitable for receiving a plurality of first detection signals through the first group of through-electrodes and a plurality of second detection signals through the second group of through-electrodes, in response to the providing of the test voltage or the ground voltage, and generating a failure signal indicating whether the first through-electrodes and the second through-electrodes are open or short, based on the plurality of first detection signals and the plurality of second detection signals.

BRIEF DESCRIPTION OF THE DRAWINGS

FIG. 10 is a truth table for explaining an operation of a test control circuit in accordance with an embodiment of the present invention.

DETAILED DESCRIPTION

Figure 1:
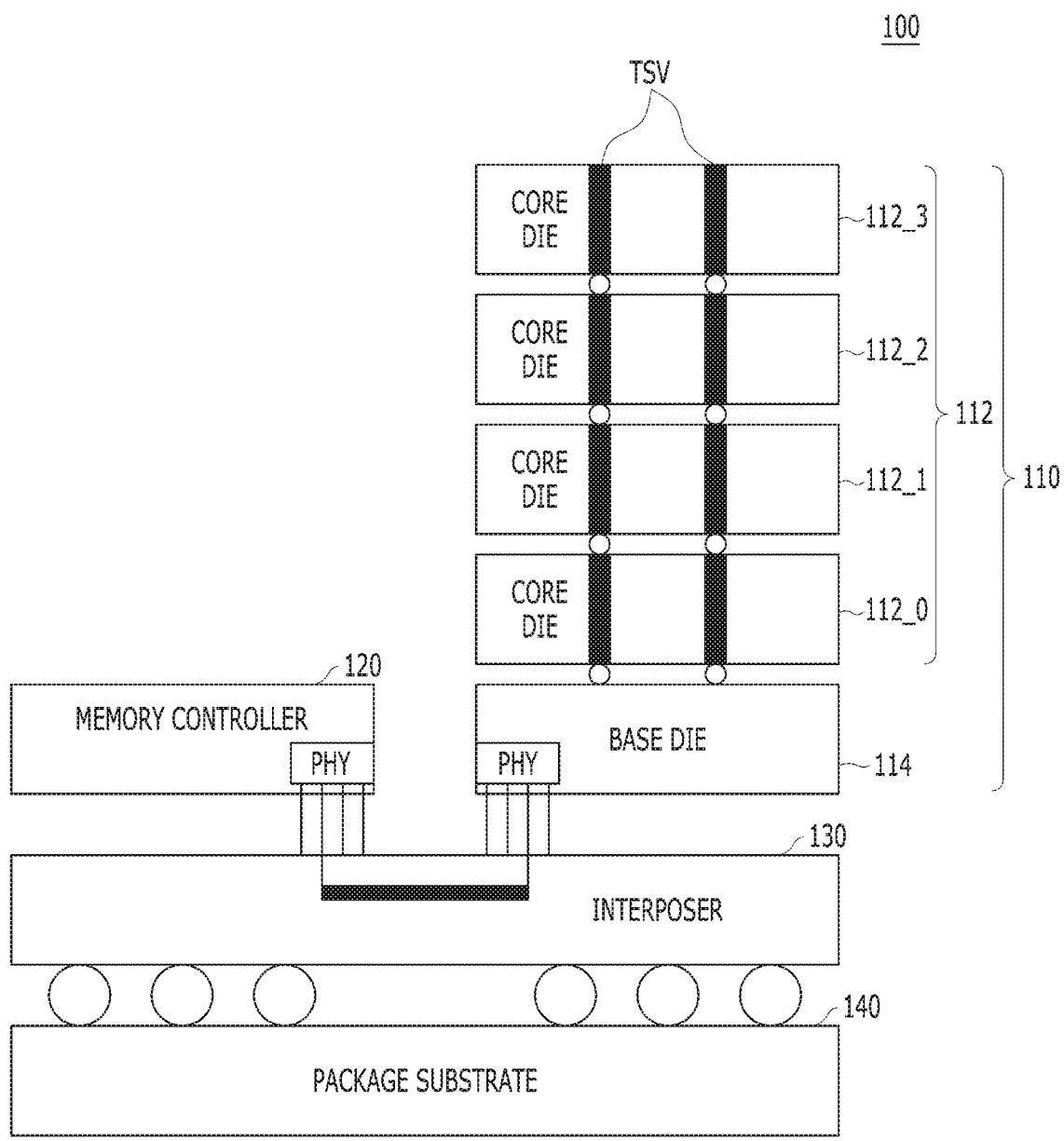
FIG. 1 is a block diagram illustrating a semiconductor memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, a semiconductor memory system will be described by taking an example of a stacked type semiconductor device. The semiconductor memory system in accordance with the embodiment of the present invention may be realized in the form of a System-In-Package (SiP), a Multi-Chip Package (MCP), a System-On-Chip (SoC), or it may be realized in the form of a Package-On-Package, which includes a plurality of packages.

FIG. 1 is a block diagram illustrating a semiconductor memory system 100 in accordance with an embodiment of the present invention.

Referring to FIG. 1, the memory system 100 may include a stacked memory device 110, a memory controller 120, an interposer 130, and a package substrate 140.

The interposer 130 may be formed over the package substrate 140. The interposer 130 may be coextensive with the package substrate 140.

The stacked memory device 110 and the memory controller 120 may be formed over the interposer 130. The stacked memory device 110 and the memory controller 120 may be positioned adjacent to each other over the interposer 130.

A physical layer PHY of the stacked memory device 110 and a physical layer PHY of the memory controller 120 may be coupled to each other through the interposer 130. The physical layer PHY of the stacked memory device 110 may be disposed in a base die 114 of the stacked memory device 110.

The stacked memory device 110 may be formed in a high bandwidth memory (HBM) structure. In accordance with the HBM structure, the number of input and output (input/output) units is increased to increase the bandwidth of the memory system 100 by stacking a plurality of dies (i.e., semiconductor chips) in the vertical direction and electrically connecting through silicon vias (or through-electrodes) (TSVs).

The plurality of dies may include the base die 114 and a plurality of core dies 112. The core dies 112 may be stacked over the base die 114 and may be coupled to one another through the through-electrodes TSV. Although FIG. 1 shows a case where four core dies 112, that is, first to fourth core dies 112_0 to 112_3, are stacked, the concept and spirit of the present invention are not limited thereto. The plurality of dies may be stacked vertically one on top of the other with the base die 114 at the bottom of the stack. The plurality of dies may all have the same size.

Each of the core dies 112 may include a plurality of memory cells for storing data and circuits for core operations of the memory cells. The base die 114 may include an interface circuit for interfacing the core dies 112 with the memory controller 120. Due to the base die 114, various functions within the semiconductor memory system 100, and timing adjustment functions between the core dies 112 and the memory controller 120, may be performed. Various functions within the semiconductor memory system 100 may include memory management functions, such as a power management function and a refresh function of the memory cells.

In order to ensure the normal operation of the core dies 112, the physical connection of the through-electrodes TSV may have to be ensured. Therefore, the through-electrodes TSV may have to pass a test, such as open and short (OS) tests. For example, if an OS test operation is performed for all through-electrodes coupled in the vertical direction and a defect is detected, a repair operation may have to be performed by using redundant through-electrodes. For example, in an embodiment (not shown) 42 redundant through-electrodes may be used. (e.g., 42 redundant through-electrodes RTSV01 to RTSV42).

Figure 2:
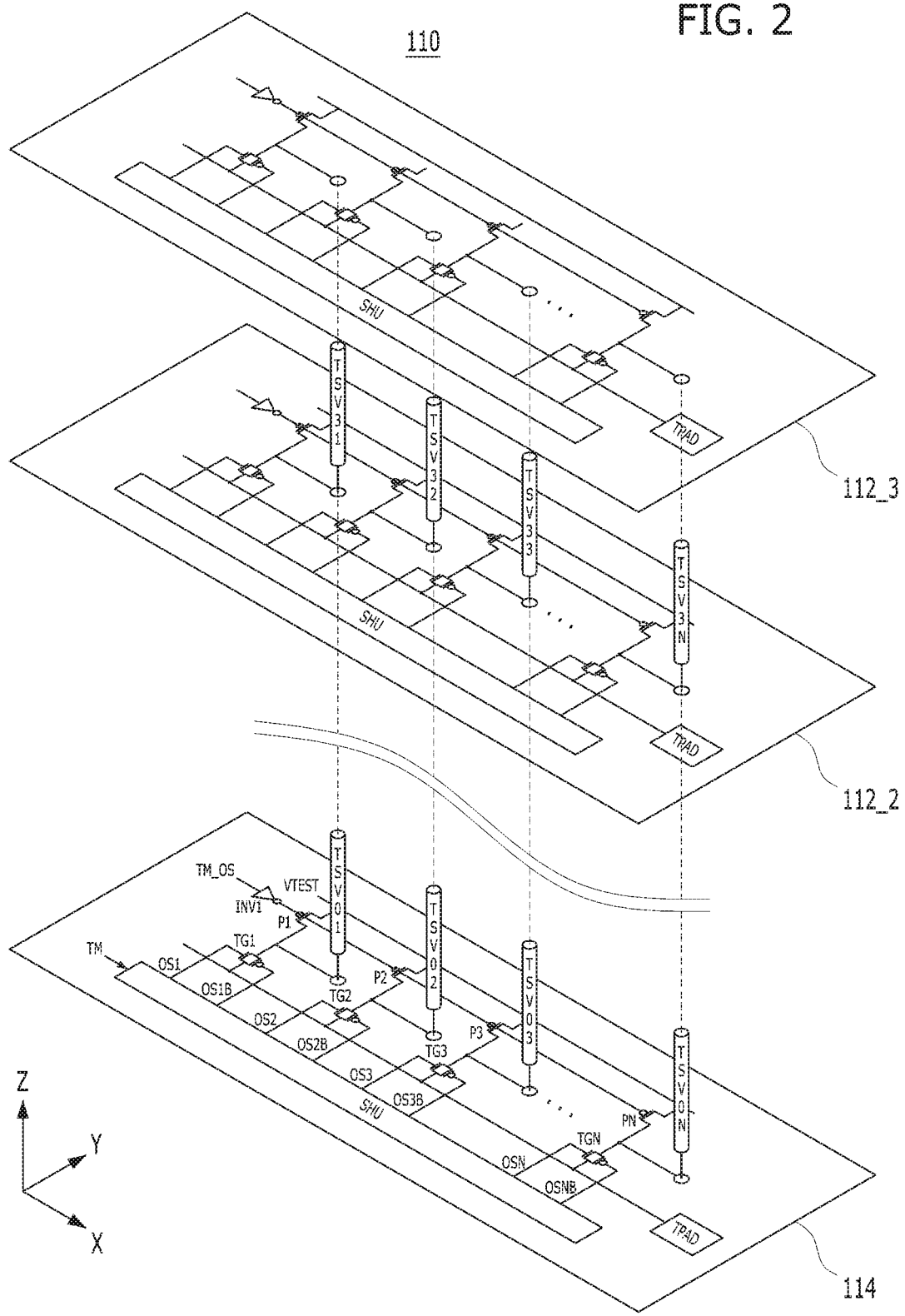
FIGS. 2 and 3 are views illustrating a structure for an open and short (OS) test operation for through-electrodes in accordance with an embodiment of the present invention.
Figure 3:
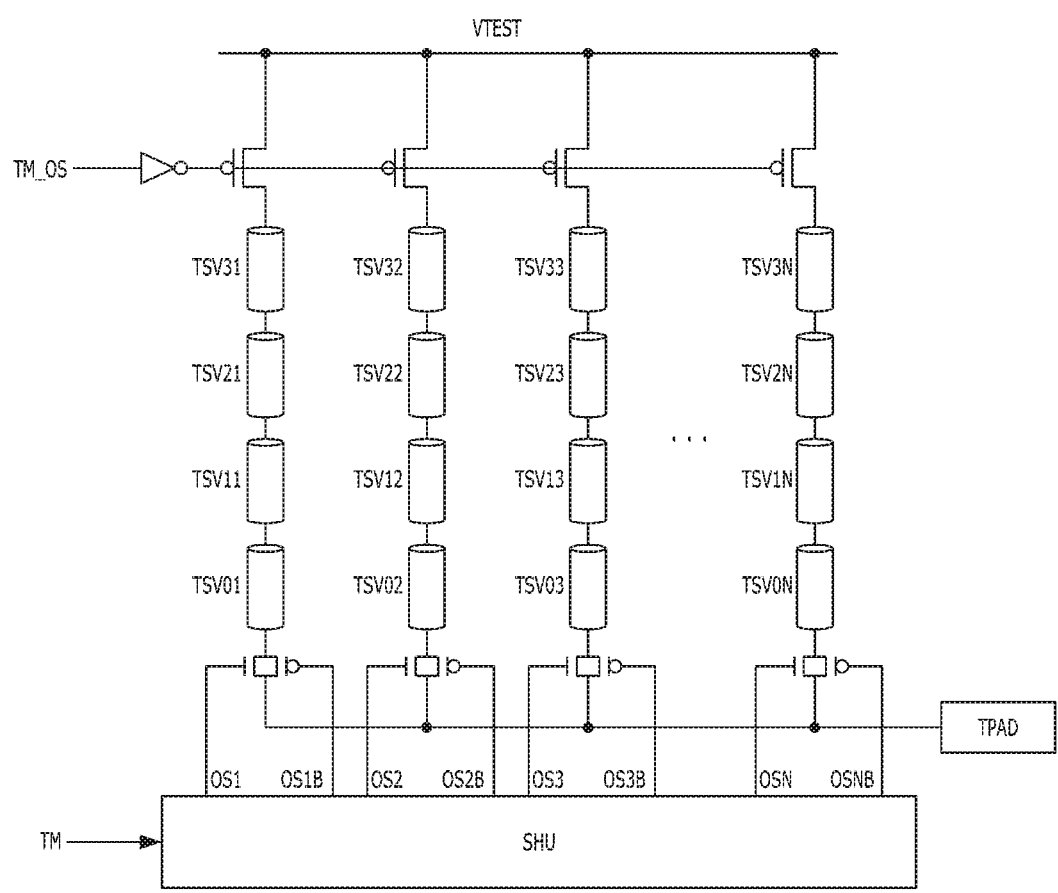

FIGS. 2 and 3 are views illustrating a structure for an open and short (OS) test operation for the through-electrodes of the stacked memory device 110 shown in FIG. 1.

Referring to FIG. 2, the stacked memory device 110 may include the base die 114 and a plurality of core dies 112_0 to 112_3. OS test operations may be performed for the dies 114, 112_0 to 112_3. The structures for each of the OS test operations for the dies 114, 112_0 to 112_3 of the stacked memory device 110 may have substantially the same structure. Hereinafter, the OS test operation for the base die 114 will be described as an example. The base die 114 may include a shifting unit SHU, a plurality of pull-up transistors P1 to PN, a plurality of transfer gates TG1 to TGN, and a test pad TPAD. In FIG. 2, a reference symbol "TM" may be a lower test signal and it may be a signal inputted to activate a shifting unit SHU of a lower die during an OS test operation. A reference symbol "TM_OS" may be an upper test signal and it may be a signal inputted to activate pull-up transistors P1 to PN of an upper die during an OS test operation. The terms lower die and upper die refer to a pair of dies for which the through-electrodes between the two dies are tested during the OS test operation. For example, if the through-electrodes between the base die and the third core die are being tested then the lower die is the base die 114 and the upper die is the third core die. Likewise, if the through-electrodes between the first core die and the third core die are being tested then the lower die is the first core die and the upper die is the third core die.

The shifting unit SHU may generate shifting signals OS1 to OSN and OS1B to OSNB that are sequentially activated based on the lower test signal TM. For reference, the shifting signals OS1B to OSNB are inverted signals of the shifting signals OS1 to OSN. The pull-up transistors P1 to PN may supply a test voltage VTEST to the through-electrodes TSV01 to TSV0N based on the upper test signal TM_OS. The pull-up transistors may be PMOS pull-up transistors. An inverter INV1 may be added to the pull-up transistors P1 to PN to receive the upper test signal TM_OS activated to a logic high level and generate an inverted upper test signal TM_OS activated to a logic low level in order to drive the pull-up transistors P1 to PN. The pull-up transistors P1 to PN may be connected between a test voltage VTEST terminal and first ends of the corresponding through-electrodes TSV01 to TSV0N and may receive the output of the inverter INV1 through their respective gates. The transfer gates TG1 to TGN may be coupled to the first ends of corresponding through-electrodes TSV01 to TSV0N, respectively. For example, transfer gate TG1 may be coupled to the first end of the through-electrode TSV01, transfer gate TG2 may be coupled to the first end of the through-electrode TSV02, transfer gate TG3 may be coupled to the first end of the through-electrode TSV03, and transfer gate TGN may be coupled to the first end of the through-electrode TSV0N. The transfer gates TG1 to TGN may be turned on based on the corresponding shifting signals OS1 to OSN and OS1B to OSNB to provide the test pad TPAD with a signal (e.g., current) transferred through the corresponding through-electrodes TSV01 to TSV0N. For example, transfer gate TG1 may be turned on based on shifting signals OS1 and OS1B, transfer gate TG2 may be turned on based on shifting signals OS2 and OS2B, transfer gate TG3 may be turned on based on shifting signals OS3 and OS3B, and transfer gate TGN may be turned on based on shifting signals OSN and OSNB. Each of the transfer gates (TG) may be a CMOS-based switch including both a PMOS and an NMOS transistor. The test pad TPAD may output signals that are sequentially transferred from the through-electrodes TSV01 to TSV0N through the transfer gates TG1 to TGN. An external device (e.g., memory controller 120 of FIG. 1) may determine the intensity of the current measured through the test pad TPAD to test whether the through-electrodes TSV01 to TSV0N are normally formed or not.

To perform the OS test operation of the through-electrodes between the base die 114 and a core die, the shifting unit SHU of the lower die and the pull-up transistors P1 to PN of the upper die may be activated. For example, as illustrated in FIG. 3, to perform the OS test operation of the through-electrodes TSV01 to TSV3N between the base die 114 and the fourth core die 112_3, the shifting unit SHU of the base die 114 and the pull-up transistors P1 to PN of the fourth core die 112_3 may be activated. Likewise, to perform the OS test operation of the through-electrodes TSV01 to TSV2N between the base die 114 and the third core die 112_2, the shifting unit SHU of the base die 114 and the pull-up transistors P1 to PN of the third core die 112_2 may be activated. Also, to perform the OS test operation of the through-electrodes TSV01 to TSV2N between the base die 114 and the second core die 112_2, the shifting unit SHU of the base die 114 and the pull-up transistors P1 to PN of the second core die 112_2 may be activated. And to perform the OS test operation of the through-electrodes TSV01 to TSV2N between the base die 114 and the first core die 112_2, the shifting unit SHU of the base die 114 and the pull-up transistors P1 to PN of the first core die 112_2 may be activated.

Figure 4:
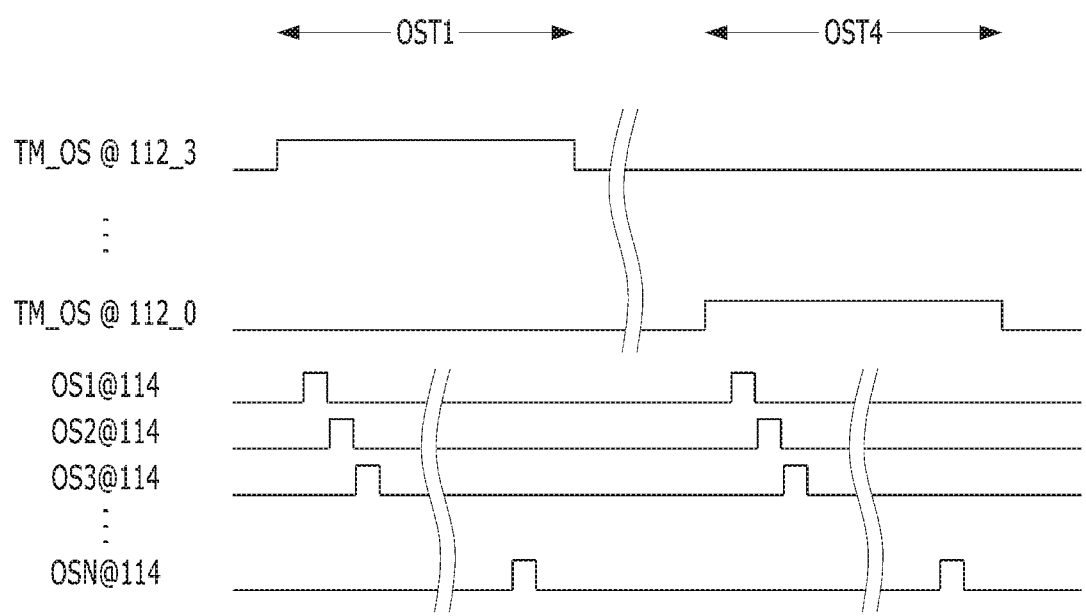
FIG. 4 is a timing diagram illustrating an open and short (OS) test operation of through-electrodes in accordance with an embodiment of the present invention.

FIG. 4 is a timing diagram illustrating an open and short (OS) test operation for the through-electrodes shown in FIG. 2.

Referring to FIG. 4, in accordance with an embodiment, an OS test operation OST1 for the through-electrodes TSV01 to TSV3N between the base die 114 and the fourth core die 112_3 in FIG. 2 may be performed first.

To this end, an upper test signal TM_OS@112_3 may be activated to activate the pull-up transistors P1 to PN of the fourth core die 112_3. The shifting unit SHU of the base die 114 may generate shifting signals OS1@114 to OSN@114. The shifting signals OS1@114 to OSN@114 are sequentially activated based on the lower test signal TM so that the transfer gates TG1 to TGN of the base die 114 may be sequentially activated based on the respective shifting signals OS1@114 to OSN@114 to provide the test pad TPAD with a signal, which is transferred through the through-electrodes TSV01 to TSV3N and perform the OS test operation OST1.

Subsequently, the OS testing operation for the through-electrodes TSV01 to TSV2N between the base die 114 and the third core die 112_2 may be performed, followed by the OS test operation for the through-electrodes TSV01 to TSV1N between the base die 114 and the second core die 112_1 may be performed, and lastly, an OS test operation OST4 of the through-electrodes TSV01 to TWV0N between the base die 114 and the first core die 112_0 may be performed.

As described above, in order to perform the OS test operation between the base die 114 and each core die 112, a test period corresponding to a multiplication of one pulse width of the shifting signals OS1@114 to OSN@114, the number of core dies (e.g., 4) and the number of TSVs (i.e., N), may be required. Also, although the above OS test operation is performed for testing signal transmission in each through-electrode in a vertical direction, a short failure may actually occur between neighboring through-electrodes. Therefore, it is required to perform an OS test operation for detecting a short failure between neighboring through-electrodes.

Hereinafter, a method for detecting a short failure of neighboring through-electrodes will be described in accordance with the embodiment of the present invention. The method may reduce the time required for the OS test operations of the through-electrodes.

Figure 5A:
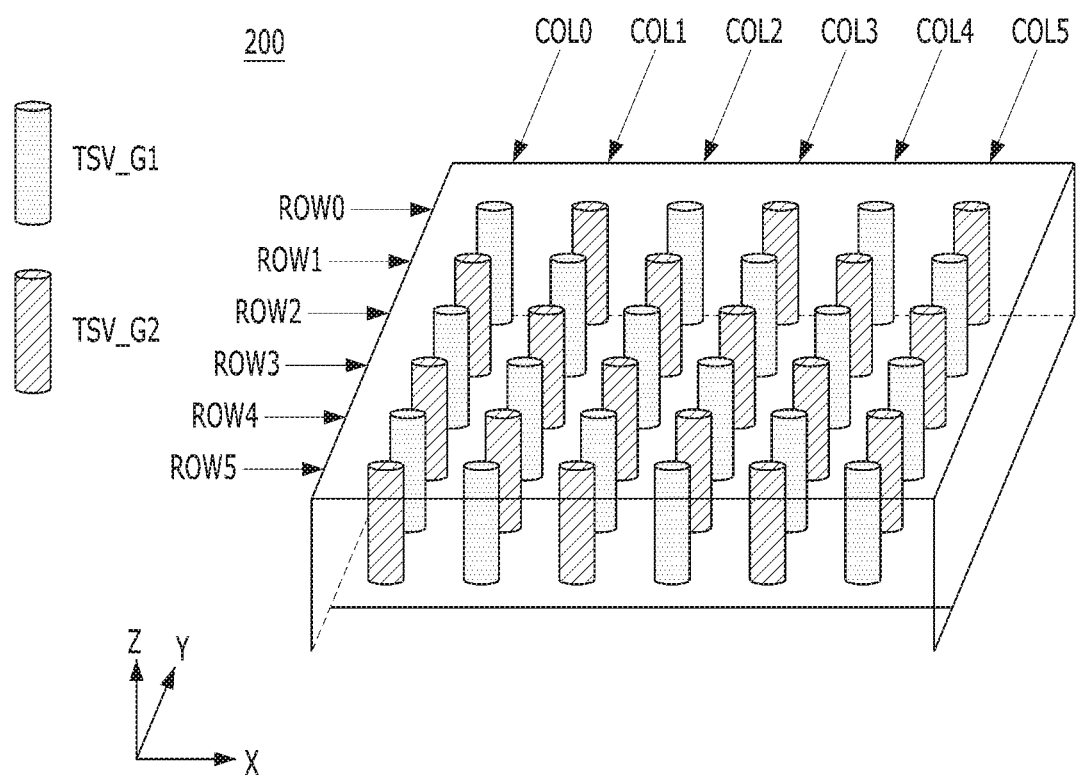
FIGS. 5A and 5B are a perspective view and a plan view of a semiconductor chip for explaining an OS test operation for through-electrodes in accordance with an embodiment of the present invention.
Figure 5B:
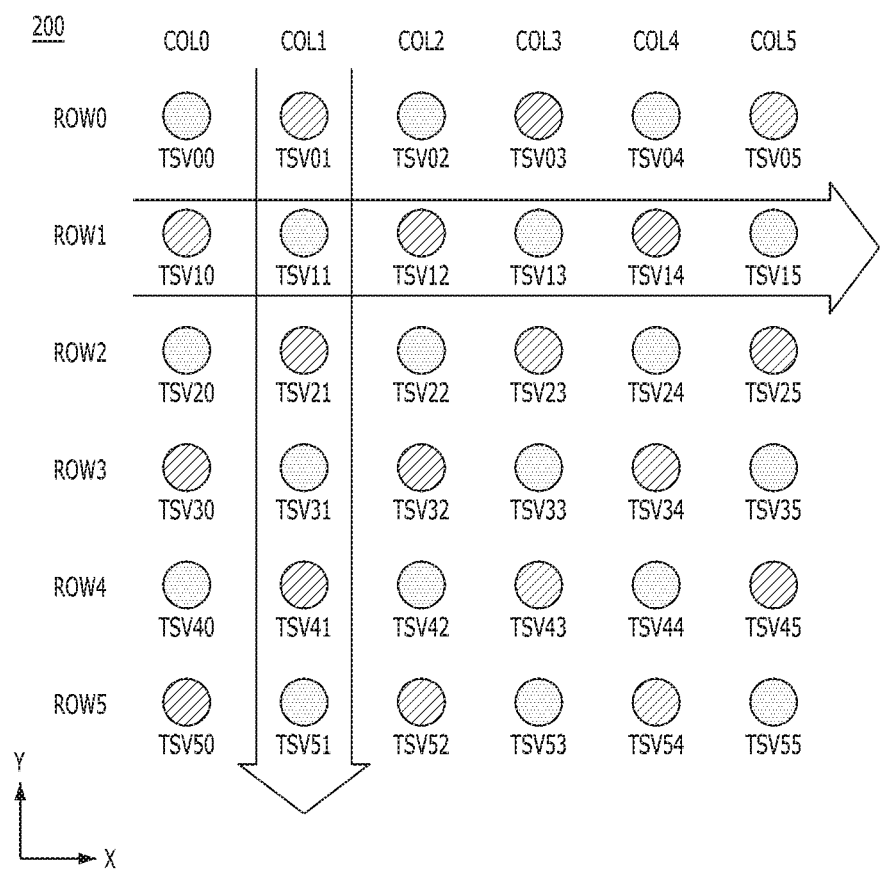

FIGS. 5A and 5B are a perspective view and a plan view of a semiconductor chip 200 for explaining an open and short (OS) test operation of through-electrodes in accordance with an embodiment of the present invention, respectively.

Referring to FIGS. 5A and 5B, the semiconductor chip 200 may include a first through-electrode group TSV_G1 that includes a plurality of through-electrodes, and a second through-electrode group TSV_G2 that includes a plurality of through-electrodes positioned adjacent to the through-electrodes of the first through-electrode group TSV_G1. In accordance with one embodiment of the present invention, the first through-electrode group TSV_G1 may include through-electrodes that are positioned at odd-numbered rows and odd-numbered columns and through-electrodes that are positioned at even-numbered rows and even-numbered columns. The second through-electrode group TSV_G2 may include through-electrodes that are positioned at odd-numbered rows and even-numbered columns and through-electrodes that are positioned at even-numbered rows and odd-numbered columns. The through-electrodes disposed in one of neighboring rows and neighboring columns of a through-electrode included in the first through-electrode group TSV_G1 may be included in the second through-electrode group TSV_G2. Also, the through-electrodes disposed in one of the neighboring rows and the neighboring columns of a through-electrode included in the second through-electrode group TSV_G2 may be included in the first through-electrode group TSV_G1. More specifically, the through-electrodes that are disposed at the intersections of the neighboring rows and the neighboring columns of a particular through-electrode may be included in the same through-electrode group as the particular through-electrode. Also, for each through-electrode of the first through-electrode group TSV_G1, the four closest through-electrodes are through-electrodes included in the second through-electrode group TSV_G2. Likewise, for each through-electrode of the second through-electrode group TSV_G2, the four closest through-electrodes are through-electrodes included in the first through-electrode group TSV_G1.

FIGS. 5A and 5B show a case where 36 through-electrodes TSV00 to TSV55 are disposed at the intersections of six rows and six columns. The through-electrodes are spaced apart at a first regular interval along a row direction X. The through-electrodes are spaced apart at a second regular interval along the column direction Y. The first and second regular intervals may be the same as shown in the embodiment of FIGS. 5A and 5B, however, the invention is not limited in this way. Through-electrodes of the first through-electrode group TSV_G1 and of the second through-electrode group TSV_G2 alternate along each column. Also, through-electrodes of the first through-electrode group TSV_G1 and of the second through-electrode group TSV_G2 alternate along each row. The odd-numbered rows may include a first row ROW0, a third row ROW2, and a fifth row ROW4, and the even-numbered rows may include a second row ROW1, a fourth row ROW3, and a sixth row ROW5. The odd-numbered columns may include a first column COL0, a third column COL2, and a fifth column COL4, and the even-numbered columns may include a second column COL1, a fourth column COL3, and a sixth column COL5. For example, when the through-electrode TSV11 positioned at the second row ROW1 and the second column COL1 is included in the first through-electrode group TSV_G1, the through-electrodes TSV01 and TSV21 that are positioned at the neighboring rows of the through-electrode TSV11, that is, the first row ROW0 and the third row ROW2, may be included in the second through-electrode group TSV_G2. Also, the through-electrodes TSV10 and TSV12 that are positioned at the neighboring columns of the through-electrode TSV11, i.e., the first column COL0 and the third column COL2, may be included in the second through-electrode group TSV_G2. Conversely, the through-electrodes TSV00, TSV02, TSV20, and TSV22 that are positioned at the intersections of the neighboring rows and the neighboring columns of the through-electrode TSV11 may be included in the same first through-electrode group TSV_G1. In other words, the first through-electrode group TSV_G1 and the second through-electrode group TSV_G2 may include through-electrodes that are positioned adjacent to each other in a diagonal direction.

Figure 6:
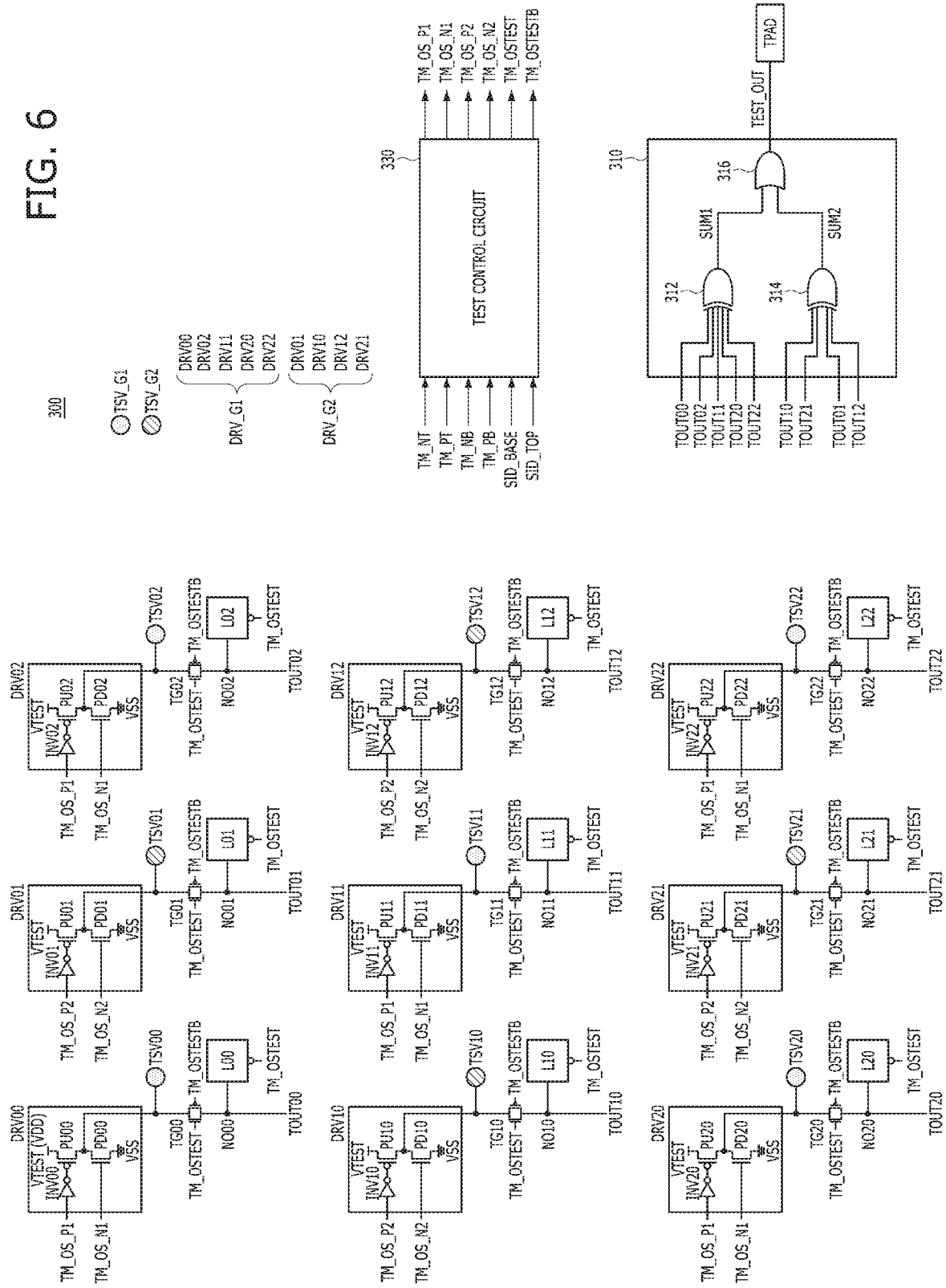
FIG. 6 is a circuit diagram showing a structure of a semiconductor chip in accordance with the embodiment of the present invention.

FIG. 6 is a circuit diagram showing a structure of a semiconductor chip 300 in accordance with the embodiment of the present invention. By way of example, FIG. 6 shows a case where nine through-electrodes are arranged at the intersections of three rows and three columns.

Referring to FIG. 6, the semiconductor chip 300 may include a first through-electrode group TSV_G1, a second through-electrode group TSV_G2, a first voltage driving circuit DRV_G1, a second voltage driving circuit DRV_G2, and a failure detection circuit 310.

The first through-electrode group TSV_G1 may include a plurality of first through-electrodes TSV00, TSV02, TSV11, TSV20 and TSV22. The second through-electrode group TSV_G2 may include a plurality of second through-electrodes TSV01, TSV10, TSV12 and TSV21 that are positioned adjacent to the first through-electrodes TSV00, TSV02, TSV11 and TSV20. The first through-electrode group TSV_G1 and the second through-electrode group TSV_G2 of FIG. 6 may have substantially the same structures and features as the first through-electrode group TSV_G1 and the second through-electrode group TSV_G2 described in FIGS. 5A and 5B. Hereinafter, the first through-electrodes TSV00, TSV02, TSV20 and TSV22 of the first through-electrode group TSV_G1 may be referred to as first through-electrodes TSV_G1, and the second through-electrodes TSV01, TSV10, TSV12 and TSV21 of the second through-electrodes TSV_G2 may be referred to as second through-electrodes TSV_G2.

The first voltage driving circuit DRV_G1 may provide the first through-electrodes TSV_G1 with a test voltage VTEST or a ground voltage VSS based on first driving control signals TM_OS_P1 and TM_OS_N1. The second voltage driving circuit DRV_G2 may provide the second through-electrodes TSV_G2 with the test voltage VTEST or the ground voltage VSS based on second driving control signals TM_OS_P2 and TM_OS_N2. The first driving control signals TM_OS_P1 and TM_OS_N1 may include a first pull-up driving signal TM_OS_P1 and a first pull-down driving signal TM_OS_N1. The second driving control signals TM_OS_P2 and TM_OS_N2 may include a second pull-up driving signal TM_OS_P2 and a second pull-down driving signal TM_OS_N2. The test voltage VTEST may be provided through a terminal for a power source voltage VDD during an OS test operation.

To be specific, the first voltage driving circuit DRV_G1 may include a plurality of first voltage driving units DRV00, DRV02, DRV11, DRV20 and DRV22 that are respectively coupled to the first through-electrodes TSV_G1. The first voltage driving units DRV00, DRV02, DRV11, DRV20 and DRV22 may include a plurality of respective first pull-up drivers PU00, PU02, PU11, PU20 and PU22 and a plurality of respective first pull-down drivers PD00, PD02, PD11, PD20 and PD22. The first pull-up drivers PU00, PU02, PU11, PU20 and PU22 may be coupled between the terminal for the power source voltage VDD and the respective first through-electrodes TSV_G1, and may receive the first pull-up driving signal TM_OS_P1 through a gate thereof. So, for example, the first pull-up driver PU00 may be coupled between the terminal for the power source voltage VDD and the first through-electrode TSV00, and may receive the first pull-up driving signal TM_OS_P1 through a gate thereof. The first pull-down drivers PD00 to PD22 may be coupled between the first through-electrodes TSV_G1 and the terminal for the ground voltage VSS, and may receive the first pull-down driving signal TM_OS_N1 through a gate thereof.

The second voltage driving circuit DRV_G2 may include a plurality of second voltage driving units DRV01, DRV10, DRV12 and DRV21 coupled to respective second through-electrodes TSV_G2. Specifically, according to FIG. 6, the second voltage driving units DRV01, DRV10, DRV12 and DRV21 are coupled to the second through-electrodes TSV01, TSV10, TSV12, and TSV21, respectively. The second voltage driving units DRV01, DRV10, DRV12 and DRV21 may include a plurality of respective second pull-up drivers PU01, PU10, PU12 and PU21 and a plurality of respective second pull-down drivers PD01, PD10, PD12 and PD21. The second pull-up drivers PU01, PU10, PU12 and PU21 may be coupled between the terminal for the power source voltage VDD and respective second through-electrodes TSV_G2 and may receive a second pull-up driving signal TM_OS_P2 through a gate thereof. For example, the second pull-up driver PU01 may be coupled between the terminal for the power source voltage VDD and the second through-electrode TSV01 and may receive a second pull-up driving signal TM_OS_P2 through a gate thereof. The second pull-down drivers PD01, PD10, PD12 and PD21 may be coupled between the respective second through-electrodes TSV_G2 and the terminal for the ground voltage VSS and may receive the second pull-down driving signal TM_OS_N2 through a gate thereof. For example, the second pull-down driver PD01 may be coupled between the second through-electrode TSV01 and the terminal for the ground voltage VSS and may receive the second pull-down driving signal TM_OS_N2 through a gate thereof.

In the embodiment of FIG. 6, the pull-up drivers PU00 to PU22 may be formed of PMOS transistors, and the pull-down drivers PD00 to PD22 may be formed of NMOS transistors. Herein, in order to drive the pull-up drivers PU00 to PU22 formed of PMOS, the first voltage driving units DRV00 to DRV22 may further include inverters INV00 to INV22 and the second voltage driving units DRV01 to DRV21 may further include inverters INV01 to INV21. The inverters INV00 to INV22 may receive the first pull-up driving signal TM_OS_P1 which is activated to a logic high level. The inverters INV01 to INV21 may receive the second pull-up driving signal TM_OS_P2 which is activated to a logic high level. Alternatively, depending on the inputted pull-up driving signals TM_OS_P1 and TM_OS_P2 activated to a logic low level, the inverters INV00 to INV22 may be omitted.

The failure detection circuit 310 may generate a failure signal TEST_OUT based on a plurality of first detection signals TOUT00, TOUT02, TOUT11, TOUT20 and TOUT22 received through the first through-electrodes TSV_G1 and a plurality of second detection signals TOUT01, TOUT10, TOUT12 and TOUT21 received through the second through-electrodes TSV_G2. The generated failure signal TEST_OUT may be outputted to an external device (for example, the memory controller 120 of FIG. 1) through the test pad TPAD. The external device may test whether the through-electrodes are normally formed or not based on the failure signal TEST_OUT transferred through the test pad TPAD.

The failure detection circuit 310 may include first to third logic units 312 to 316.

The first logic unit 312 may perform a logic XOR operation onto the first detection signals TOUT00, TOUT02, TOUT11, TOUT20, and TOUT22 so as to output a first sum signal SUM1. The first logic unit 312 may detect whether the first detection signals TOUT00, TOUT02, TOUT11, TOUT20, and TOUT22 have the same logic level or not so as to generate the first sum signal SUM1. The second logic unit 314 may perform a logic XOR operation onto the second detection signals TOUT10, TOUT21, TOUT01, and TOUT12 so as to output a second sum signal SUM2. The second logic unit 314 may detect whether the second detection signals TOUT10, TOUT21, TOUT01, and TOUT12 have the same logic level or not so as to generate the second sum signal SUM2. The third logic unit 316 may perform a logic OR operation onto the output of the first sum signal SUM1 and the second sum signal SUM2 and output the result as a failure signal TEST_OUT. In accordance with one embodiment of the present invention, the first and second logic units 312 and 314 may be formed of XOR gates. Meanwhile, although FIG. 6 illustrates a plurality of detection signals inputted in parallel into each of the XOR gates, the concept and spirit of the present invention are not limited thereto. In accordance with one embodiment of the present invention, the first and second logic units 312 and 314 may be formed of a multi-stage XOR to receive a plurality of detection signals sequentially.

In the above structure, the failure detection circuit 310 may output a failure signal TEST_OUT having a logic low level, when all of the first detection signals TOUT00, TOUT02, TOUT11, TOUT20, and TOUT22 have the same level and when all of the second detection signals TOUT10, TOUT21, TOUT01, and TOUT12 have the same level. On the other hand, when even one among the first detection signals TOUT00, TOUT02, TOUT11, TOUT20, and TOUT22 has a different level or even one among the second detection signals TOUT10, TOUT21, TOUT01, and TOUT12 has a different level, the failure detection circuit 310 may output a failure signal TEST_OUT having a logic high level. When the failure signal TEST_OUT having a logic high level is outputted, the external device may determine that a defect has occurred in the through-electrodes.

The semiconductor chip 300 may further include a plurality of transfer gates TG00 to TG22 and a plurality of latch units L00 to L22 corresponding to the first and second through-electrodes TSV_G1 and TSV_G2.

The transfer gates TG00 to TG22 may couple the first and second through-electrodes TSV_G1 and TSV_G2 and the output nodes NO00 to NO22 to each other according to the activation of lower test signals TM_OSTEST and TM_OSTESTB. In other words, the transfer gates TG00 to TG22 may output signals received through the first through-electrodes TSV_G1 as the first detection signals TOUT00, TOUT02, TOUT11, TOUT20, and TOUT22 and output signals received through the second through-electrodes TSV_G2 as the second detection signals TOUT10, TOUT21, TOUT01, and TOUT12 according to the activation of the lower test signals TM_OSTEST and TM_OSTESTB. The transfer gates TG00 to TG22 may be coupled to the first and second through-electrodes TSV_G1 and TSV_G2.

Figure 7:
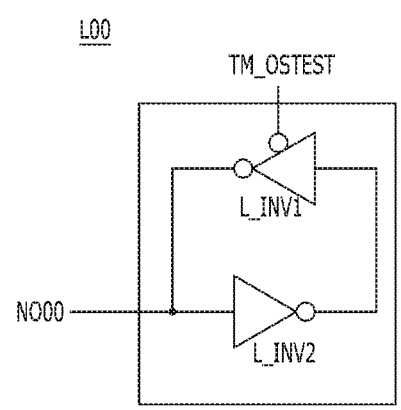
FIG. 7 is a circuit diagram of a latch unit in accordance with an embodiment of the present invention.

The latch units L00 to L22 may latch signals of the output nodes NO00 to NO22 according to the deactivation of the lower test signals TM_OSTEST and TM_OSTESTB. The signals of the output nodes NO00 to NO22 may be outputted as the first detection signals TOUT00, TOUT02, TOUT11, TOUT20, and TOUT22 and the second detection signals TOUT10, TOUT21, TOUT01, and TOUT12. For example, as shown in FIG. 7, the latch unit L00 may include a first inverter L_INV1 and a second inverter L_INV2. The first inverter L_INV1 may be enabled according to the deactivation of the lower test signal TM_OSTEST and may include an output terminal coupled to the output node NO00. The second inverter L_INV2 may include an input terminal coupled to the output node NO00, and an output terminal coupled to the input terminal of the first inverter L_INV1.

In the above structure, when the lower test signals TM_OSTEST and TM_OSTESTB are activated, the transfer gates TG00 to TG22 may transfer signals received through the first and second through-electrodes TSV_G1 and TSV_G2 as the first detection signals TOUT00, TOUT02, TOUT11, TOUT20, and TOUT22 and the second detection signals TOUT10, TOUT21, TOUT01, and TOUT12 at one time, and when the lower test signals TM_OSTEST and TM_OSTESTB are deactivated, the latch units L00 to L22 may latch the transferred first detection signals TOUT00, TOUT02, TOUT11, TOUT20, and TOUT22 and the second detection signals TOUT10, TOUT21, TOUT01, and TOUT12.

Referring back to FIG. 6, the semiconductor chip 300 may further include a test control circuit 330.

The test control circuit 330 may generate the first driving control signals TM_OS_P1 and TM_OS_N1, the second driving control signals TM_OS_P2 and TM_OS_N2, and the lower test signals TM_OSTEST and TM_OSTESTB. The test control circuit 330 may generate signals based on an upper ID signal SID_TOP, a lower ID signal SID_BASE, first and second pull-up control signals TM_PT and TM_PB, and first and second pull-down control signals TM_NT and TM_NB. Herein, the upper ID signal SID_TOP may be a signal that is activated when the corresponding semiconductor chip is the uppermost chip (for example, a core die) among the semiconductor chips including the through-electrode to be tested during the OS test operation. The lower ID signal SID_BASE may be a signal that is activated when the semiconductor chip is the lowermost chip (for example, a base die) among the semiconductor chips including the through-electrode to be tested during the OS test operation.

When the upper ID signal SID_TOP is activated, the test control circuit 330 may generate the first driving control signals TM_OS_P1 and TM_OS_N1 based on the first pull-up control signal TM_PT and the first pull-down control signal TM_NT, and generate the second driving control signals TM_OS_P2 and TM_OS_N2 based on the second pull-up control signal TM_PB and the second pull-down control signal TM_NB. Conversely, when the upper ID signal SID_TOP is deactivated, the test control circuit 330 may fix the first and second pull-up driving signals TM_OS_P1 and TM_OS_P2 and the first and second pull-down driving signals TM_OS_N1 and TM_OS_N2 to a particular logic level (for example, a logic low level) and output them. In other words, when the corresponding semiconductor chip is not the uppermost chip and the upper ID signal SID_TOP is deactivated, the pull-up drivers PU00 to PU22 and the pull-down drivers PD00 to PU22 of the first and second voltage driving circuits DRV_G1 and DRV_G2 are turned off, thereby making the first and second through-electrodes TSV_G1 and TSV_G2 float.

When the lower ID signal SID_BASE is activated, the test control circuit 330 may activate and output the lower test signals TM_OSTEST and TM_OSTESTB based on the first and second pull-up control signals TM_PT and TM_PB and the first and second pull-down control signals TM_NT and TM_NB. Herein, the lower test signals TM_OSTEST and TM_OSTESTB may include a lower test signal TM_OSTEST activated to a logic high level and a lower test signal bar TM_OSTESTB activated to a logic low level.

Figure 8:
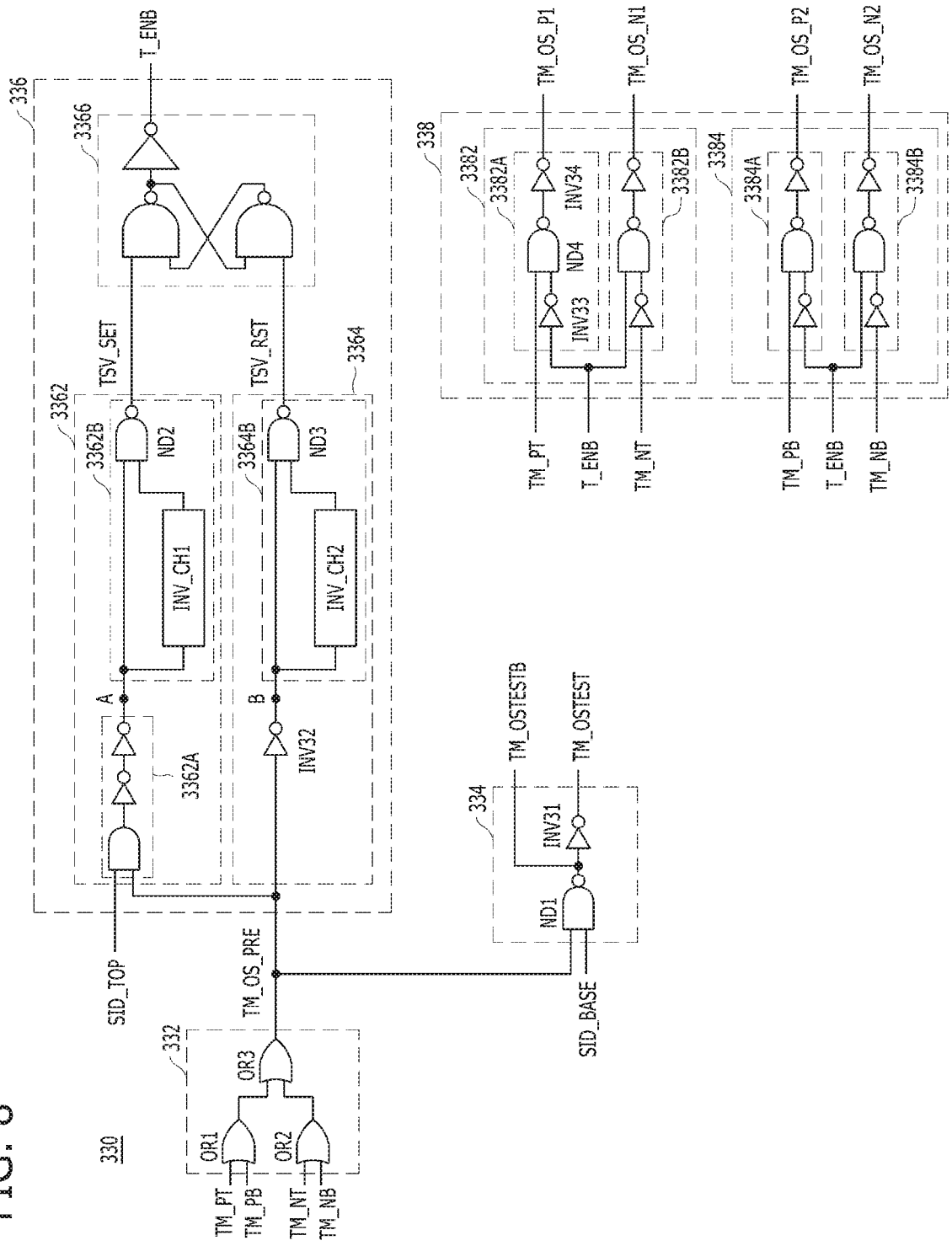
FIG. 8 is a circuit diagram of a test control circuit in accordance with an embodiment of the present invention.

Referring to FIG. 8, the test control circuit 330 may include a first test signal generation unit 332, a second test signal generation unit 334, an enable signal generation unit 336, and a control signal generation unit 338.

The first test signal generation unit 332 may generate a preliminary test signal TM_OS_PRE based on the first and second pull-up control signals TM_PT and TM_PB or the first and second pull-down control signals TM_NT and TM_NB. When one among the first and second pull-up control signals TM_PT and TM_PB and the first and second pull-down control signals TM_NT and TM_NB is activated, the first test signal generation unit 332 may generate the preliminary test signal TM_OS_PRE. The first test signal generation unit 332 may include a first OR gate OR1, a second OR gate OR2 and a third OR gate OR3. The first OR gate OR1 may perform a logic OR operation onto the first and second pull-up control signals TM_PT and TM_PB. The second OR gate OR2 may perform a logic OR operation onto the first and second pull-down control signals TM_NT and TM_NB. The third OR gate OR3 may perform a logic OR operation onto the output of the first OR gate OR1 and the output of the second OR gate OR2 to output the preliminary test signal TM_OS_PRE.

The second test signal generation unit 334 may generate the lower test signals TM_OSTEST and TM_OSTESTB based on the lower ID signal SID_BASE and the preliminary test signal TM_OS_PRE. When the lower ID signal SID_BASE is activated, the second test signal generation unit 334 may output the preliminary test signal TM_OS_PRE as the lower test signal TM_OSTEST and output an inverted signal of the preliminary test signal TM_OS_PRE as the lower test signal bar TM_OSTESTB. The second test signal generation unit 334 may include a first NAND gate ND1 and a first inverter INV31. The first NAND gate ND1 may perform a logic NAND operation onto the lower ID signal SID_BASE and the preliminary test signal TM_OS_PRE to output a lower test signal bar TM_OSTESTB. The first inverter INV31 may invert the lower test signal bar TM_OSTESTB and output the lower test signal TM_OSTEST.

When the upper ID signal SID_TOP is activated, the enable signal generation unit 336 may generate a test enable signal T_ENB that is activated in response to a rising edge of the preliminary test signal TM_OS_PRE and deactivated in response to a falling edge of the preliminary test signal TM_OS_PRE. The test enable signal T_ENB may be a signal that is activated to a logic low level.

The enable signal generation unit 336 may include a set signal generator 3362, a reset signal generator 3364, and an SR latch 3366.

When the upper ID signal STD_TOP is activated, the set signal generator 3362 may generate a set signal TSV_SET that pulses in the initial section of the activation section of the preliminary test signal TM_OS_PRE. The set signal generator 3362 may include a set input element 3362A and a first pulse generation element 3362B. The set input element 3362A may perform a logic AND operation onto the upper ID signal SID_TOP and the preliminary test signal TM_OS_PRE. The first pulse generation element 3362B may generate a set signal TSV_SET which pulses upon receipt of the output A of the set input element 3362A. The first pulse generation element 3362B may include a first inverter chain INV_CH1 and a second NAND gate ND2. The first inverter chain INV_CH1 may invert and delay the output A of the set input element 3362A. The second NAND gate ND2 may perform a logic NAND operation onto the output of the first inverter chain INV_CH1.

The reset signal generator 3364 may generate a reset signal TSV_RST that pulses during a portion of an initial section of a deactivation section of the preliminary test signal TM_OS_PRE. The reset signal generator 3364 may include a second inverter element INV32 and a second pulse generation element 3364B. The second inverter element INV32 may invert the preliminary test signal TM_OS_PRE. The second pulse generation element 3364B may generate the reset signal TSV_RST that pulses upon receipt of the output B of the second inverter element INV32. The second pulse generation element 3364B may include a second inverter chain INV_CH2 and a third NAND gate ND3. The second inverter chain INV_CH2 may invert and delay the output B of the second inverter element INV32. The third NAND gate ND3 may perform a logic NAND operation onto the output B of the second inverter element INV32 and the output of the second inverter chain INV_CH2.

The SR latch 3366 may generate the test enable signal T_ENB that is activated to a logic low level based on the set signal TSV_SET and deactivated to a logic high level based on the reset signal TSV_RST.

Figure 9:
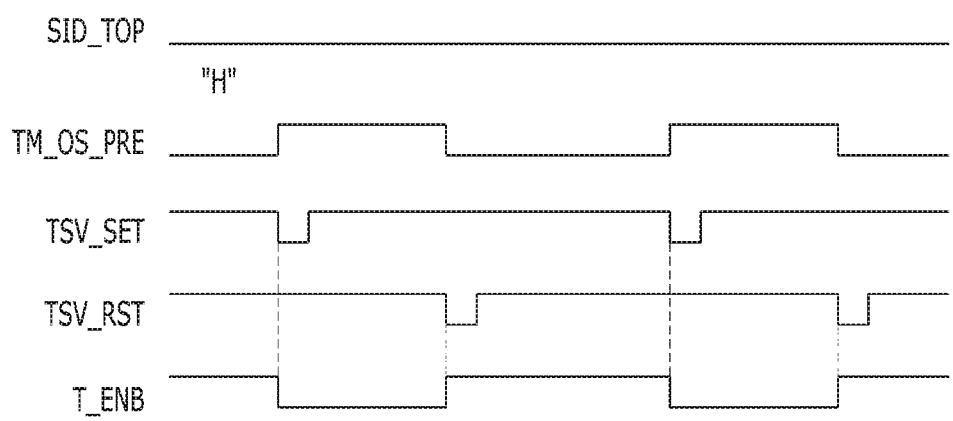
FIG. 9 is a timing diagram illustrating an operation of an enable signal generation unit in accordance with an embodiment of the present invention.

FIG. 9 is a timing diagram for explaining an operation of an enable signal generation unit in accordance with an embodiment of the present invention, for example, the enable signal generation unit 336 in FIG. 8. Referring to FIG. 9, when the upper ID signal SID_TOP is activated, the set signal generator 3362 may generate the set signal TSV_SET that pulses in an initial section of an activation section of the preliminary test signal TM_OS_PRE. The reset signal generator 3364 may generate the reset signal TSV_RST that pulses during a portion of the initial section of a deactivation section of the preliminary test signal TM_OS_PRE. The SR latch 3366 may generate a test enable signal T_ENB that is activated to a logic low level based on the set signal TSV_SET and deactivated to a logic high level based on the reset signal TSV_RST.

Referring back to FIG. 8, when the test enable signal T_ENB is activated, the control signal generation unit 338 may generate the first pull-up driving signal TM_OS_P1 and the first pull-down driving signal TM_OS_N1 based on the first pull-up control signal TM_PT and the first pull-down control signal TM_NT. Further, the control signal generation unit 338 may generate the second pull-up driving signal TM_OS_P2 and the second pull-down driving signal TM_OS_N2 based on the second pull-up control signal TM_PB and the second pull-down control signal TM_NB.

The control signal generation unit 338 may include a first output component 3382 and a second output component 3384.

When the test enable signal T_ENB is activated, the first output component 3382 may output the first pull-up control signal TM_PT and the first pull-down control signal TM_NT as the first pull-up driving signal TM_OS_P1 and the first pull-down driving signal TM_OS_N1. When the test enable signal T_ENB is deactivated, the first output component 3382 may fix the first pull-up driving signal TM_OS_P1 and the first pull-down driving signal TM_OS_N1 to a logic low level and output them.

When the test enable signal T_ENB is activated, the second output component 3384 may output the second pull-up control signal TM_PB and the second pull-down control signal TM_NB as the second pull-up driving signal TM_OS_P2 and the second pull-down driving signal TM_OS_N2. When the test enable signal T_ENB is deactivated, the second output component 3384 may fix the second pull-up driving signal TM_OS_P2 and the second pull-down driving signal TM_OS_N2 to a logic low level and output them.

The first output component 3382 may include a first output element 3382A and a second output element 3382B. The second output component 3384 may include a third output element 3384A and a fourth output element 3384B. The first output element 3382A may include a third inverter INV33, a fourth inverter INV34 and a fourth NAND gate ND4. The third inverter INV33 may invert the test enable signal T_ENB. The fourth NAND gate ND4 and the fourth inverter INV34 may output the first pull-up driving signal TM_OS_P1 by performing a logic AND operation onto the output of the third inverter INV33 and the first pull-up control signal TM_PT. The second to fourth output elements 3382B, 3384A and 3384B may have substantially the same structure as the structure of the first output element 3382A.

FIG. 10 is a truth table for explaining an operation of a test control circuit in accordance with an embodiment of the present invention, for example, the test control circuit 330 shown in FIG. 8. By way of example, FIG. 10 illustrates a case where the upper ID signal SID_TOP is activated when the corresponding semiconductor chip is the uppermost chip during an open and short (OS) test operation.

Referring to FIG. 10, during a normal operation (i.e., NORMAL), the first and second pull-up control signals TM_PT and TM_PB and the first and second pull-down control signals TM_NT and TM_NB are all deactivated to a logic low level "0". Accordingly, the first and second pull-up driving signals TM_OS_P1 and TM_OS_P2 and the first and second pull-down driving signals TM_OS_N1 and TM_OS_N2 are all outputted to a logic low level "0". As a result, the first and second pull-up drivers PU00 to PU22 and the first and second pull-down drivers PD00 to PD22 are turned off, thereby making the first and second through-electrodes TSV_G1 and TSV_G2 float.

The test operation in accordance with the present invention may be divided into six types or modes, which are described below.

TM-1: All High Charge

In a first test mode TM-1, the first and second pull-up control signals TM_PT and TM_PB may be inputted at a logic high level "1". Thus, the preliminary test signal TM_OS_PRE may be activated to a logic high level "1", and the test enable signal T_ENB may be activated to a logic low level "0". As a result, since the first and second pull-up driving signals TM_OS_P1 and TM_OS_P2 are all outputted at a logic high level "1", the first and second pull-up drivers PU00 to PU22 may be turned on and the first and second through-electrodes TSV_G1 and TSV_G2 may be charged with the test voltage VTEST.

TM-2: All Low Charge

In a second test mode TM-2, the first and second pull-down control signals TM_NT and TM_NB may be inputted at a logic high level "1". Thus, the preliminary test signal TM_OS_PRE may be activated to a logic high level "1", and the test enable signal T_ENB may be activated to a logic low level "0". As a result, since the first and second pull-down driving signals TM_OS_N1 and TM_OS_N2 are all outputted at a logic high level "1", all the pull-down drivers PU00 to PU22 may be turned on, and the first and second through-electrodes TSV_G1 and TSV_G2 may be discharged with a ground voltage VSS.

TM-3 True Only High Charge

In a third test mode TM-3, only the first pull-up control signal TM_PT may be inputted at a logic high level "1". Thus, the preliminary test signal TM_OS_PRE may be activated to a logic high level "1", and the test enable signal T_ENB may be activated to a logic low level "0". As a result, since only the first pull-up driving signal TM_OS_P1 is outputted at a logic high level "1", the first pull-up drivers PU00 to PU22 may be turned on, and the second pull-up drivers PU01 to PU21, the first pull-down drivers PD00 to PD22 and the second pull-down drivers PD01 to PD21 may be turned off. Therefore, only the first through-electrodes TSV_G1 may be charged with the test voltage VTEST, and the second through-electrodes TSV_G2 may float.

TM-4: True Only Low Charge

In a fourth test mode TM-4, only the first pull-down control signal TM_NT may be inputted at a logic high level "1". Thus, the preliminary test signal TM_OS_PRE may be activated to a logic high level "1", and the test enable signal T_ENB may be activated to a logic low level "0". As a result, since only the first pull-down driving signal TM_OS_N1 is outputted at a logic high level "1", the first pull-down drivers PD00 to PD22 are turned on and the first pull-up drivers PU01 to PU21, the second pull-up drivers PU00 to PU22 and the second pull-down drivers PD01 to PD21 may be turned off. Therefore, only the first through-electrodes TSV_G1 may be discharged with the ground voltage VSS, and the second through-electrodes TSV_G2 may float.

TM-5: Bar Only High Charge

In a fifth test mode TM-5, only the second pull-up control signal TM_PB may be inputted at a logic high level "1". As a result, only the second pull-up driving signal TM_OS_P2 may be outputted at a logic high level "1". Thus, the second pull-up drivers PU01 to PU21 may be turned on, and the first pull-up drivers PU00 to PU22, the first pull-down drivers PD00 to PD22 and the second pull-down drivers PD01 to PD21 may be turned off. Therefore, only the second through-electrodes TSV_G2 may be charged with the test voltage VTEST, and the first through-electrodes TSV_G1 may float.

TM-6: Bar Only Low Charge

In a sixth test mode TM-6, only the second pull-down control signal TM_NB may be inputted at a logic high level "1". As a result, only the second pull-down driving signal TM_OS_N2 may be outputted at a logic high level "1". Thus, the second pull-down drivers PU01 to PU21 may be turned on, and the first pull-up drivers PU00 to PU20, the second pull-up drivers PU00 to PU21 and the first pull-down drivers PD00 to PD22 may be turned off. Therefore, only the second through-electrodes TSV_G2 may be discharged with the ground voltage VSS, and the first through-electrodes TSV_G1 may float.

Meanwhile, when the semiconductor chip is not the uppermost chip and the upper ID signal SID_TOP is deactivated, the test enable signal T_ENB may be kept to be deactivated in a logic high level "1". Accordingly, the first and second pull-up driving signals TM_OS_P1 and TM_OS_P2 and the first and second pull-down driving signals TM_OS_N1 and TM_OS_N2 may be outputted at a logic low level "0", and the first and second pull-up drivers PU00 to PU22 and the first and second pull-down drivers PD00 to PD22 may be turned off, thus making the first and second through-electrodes TSV_G1 and TSV_G2 float.

In accordance with an embodiment of the present invention, when the logic levels of the first pull-up control signal TM_PT and the second pull-up control signal TM_PB are inverted and inputted (i.e., the third and fifth test modes) or the logic levels of the first pull-down control signal TM_NT and the second pull-down control signal TM_NB are inverted and inputted (i.e., the fourth and sixth test modes), only one among the first through-electrodes TSV_G1 and the second through-electrodes TSV_G2 may be charged or discharged. In accordance with an embodiment of the present invention, during an OS test operation, the third to sixth test modes may begin to detect a shortage between the neighboring through-electrodes.

Figure 11:
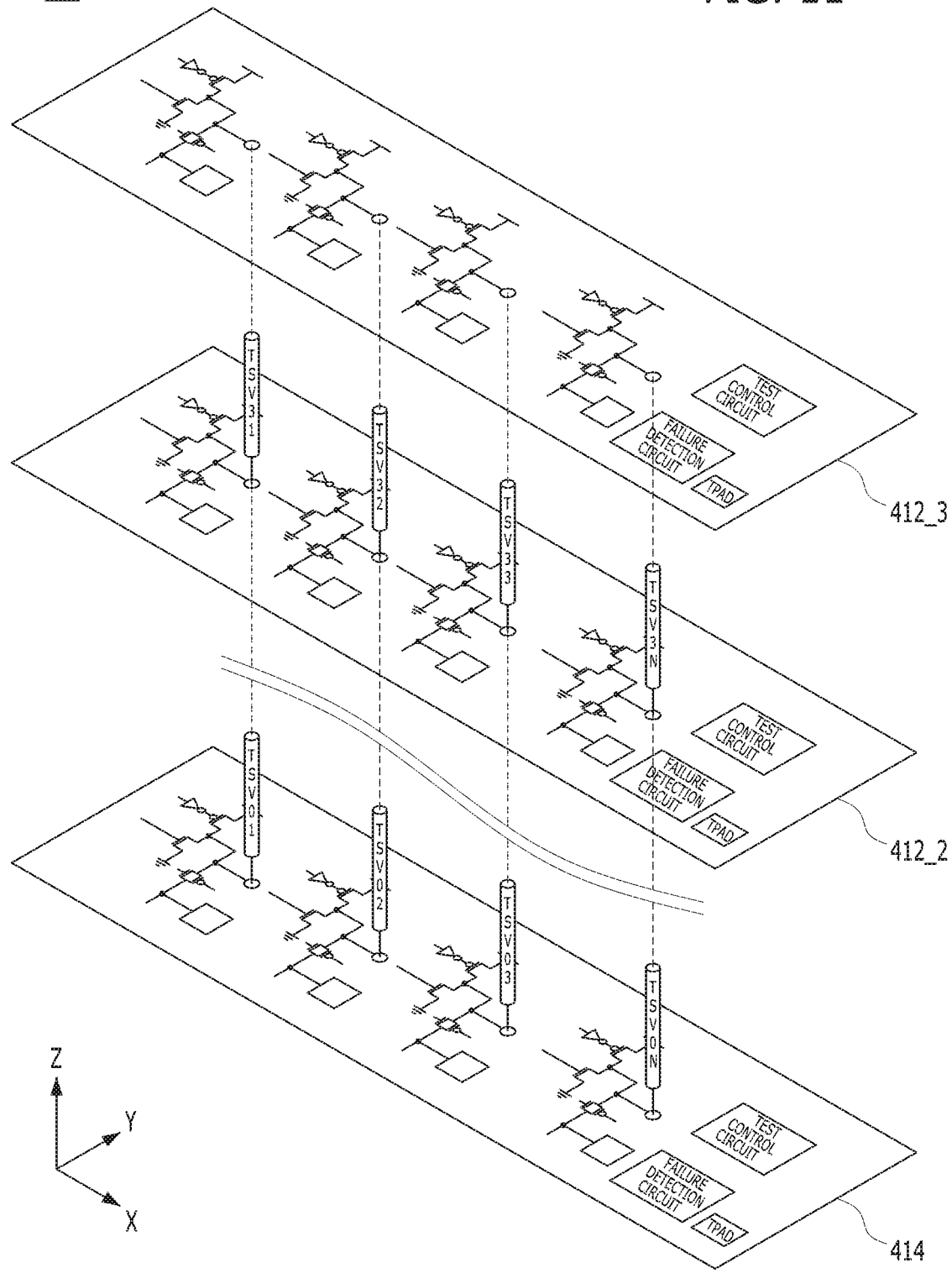
FIG. 11 is a perspective view illustrating a stacked memory device in accordance with an embodiment of the present invention.

FIG. 11 is a perspective view illustrating a stacked memory device 400 in accordance with an embodiment of the present invention. In FIG. 11, for convenience, signals inputted to each constituent element are omitted.

Referring to FIG. 11, the stacked memory device 400 may include a plurality of dies 414, 412_0 to 412_3. The semiconductor chip 300 of FIG. 6 may correspond to the plurality of dies 414, 412_0 to 412_3 of the stacked memory device 400, respectively.

In order to perform an open and short (OS) test operation of the through-electrodes TSV01 to TSV3N between the base die 414 and the fourth core die 412_3, the lower ID signal SID_BASE of the base die 414 may be activated and the upper ID signal SID_TOP of the fourth core die 412_3 may be activated. Subsequently, to perform an OS test operation of the through-electrodes TSV01 to TSV2N between the base die 414 and the third core die 412_2, the lower ID signal SID_BASE of the base die 414 may be activated, and the upper ID signal SID_TOP of the third core die 412_2 may be activated. In this manner, the OS test operation of the through-electrodes between the base die 414 and each of the core dies 412_0 to 412_3 may be performed by activating the lower ID signal SID_BASE of the base die 414 and the upper ID signal SID_TOP of each of the core dies 412_0 to 412_3.

Herein, in accordance with an embodiment of the present invention, the first test mode (e.g., TM-1 of FIG. 10) and the second test mode (e.g., TM-2 of FIG. 10) may sequentially begin during each OS test operation, or the second test mode and the first test mode may sequentially begin during each OS test operation.

When the first test mode begins, the pull-up drivers PU00 to PU22 of the upper core dies 412_0 to 412_3 may be turned on, and target through-electrodes between the upper core dies 412_0 to 412_3 and the lower base 414 may be charged with the voltage VTEST. Also, the transfer gates TG00 to TG22 of the base die 414 may be simultaneously turned on based on the lower test signals TM_OSTEST and TM_OSTESTB. Thus, the failure detection circuit 310 may generate the failure signal TEST_OUT based on the first detection signals TOUT00, TOUT02, TOUT11, TOUT20, and TOUT22 and the second detection signals TOUT10, TOUT21, TOUT01, and TOUT12. The external device (e.g., the memory controller 120 of FIG. 1) may determine whether the through-electrodes are defective or not based on the failure signal TEST_OUT. For example, when the failure signal TEST_OUT having a logic high level is outputted, the external device may decide that a short failure occurs between the terminal for the power source voltage VDD and the through-electrodes, or an open failure occurs between the through-electrodes coupled in the vertical direction.

When the second test mode begins, the target through-electrodes may be discharged with the ground voltage VSS, and the failure detection circuit 310 may generate a failure signal TEST_OUT based on the first detection signals TOUT00, TOUT02, TOUT11, TOUT20, and TOUT22 and the second detection signals TOUT10, TOUT21, TOUT01, and TOUT12. The external device may determine whether the through-electrodes are defective or not based on the failure signal TEST_OUT. For example, when the failure signal TEST_OUT having a logic high level is outputted, the external device may decide that a short failure occurs between the terminal for the ground voltage VSS and the through-electrodes, or an open failure occurs between the through-electrodes coupled in the vertical direction.

As described above, in accordance with an embodiment of the present invention, a charge operation may be performed once and a discharge operation may be performed once during each OS test operation, and it is possible to determine whether the through-electrodes are defective or not based on the voltage level transferred through the target through-electrodes.

In the case of the typical OS test operation described in FIGS. 2 to 4, in order to perform an OS test operation between the base die 114 and each of the core dies 112, a test period corresponding to a multiplication of one pulse width of the shifting signals OS1@114 to OSN@114, the number of core dies and the number of TSVs, may be required. In contrast, in the case of the OS test operation described in the present invention, in order to perform the OS test operation between the base die 414 and each of the core dies 412_0 to 412_3, a test period corresponding to a multiplication of 2 (for the first test mode and the second test mode), one pulse width of the shifting signals OS1@114 to OSN@114, and the number of core dies, may be required. In other words, in accordance with an embodiment of the present invention, a plurality of through-electrodes may be tested at one time during a single OS test operation, thus reducing the test period as much as 2/TSV times, compared to the conventional technology.

Meanwhile, in accordance with an embodiment of the present invention, during the OS test operation, it is possible to enter the third to sixth test modes and detect a shortage between the neighboring through-electrodes.

When the third or fifth test mode begins, one among the first through-electrodes TSV_G1 and the second through-electrodes TSV_G2 of the target through-electrodes may be charged with the test voltage VTEST, while the other through-electrodes float. Also, the transfer gates TG00 to TG22 of the base die 414 may be simultaneously turned on based on the lower test signals TM_OSTEST and TM_OSTESTB, and the failure detection circuit 310 may generate the failure signal TEST_OUT based on the first detection signals TOUT00, TOUT02, TOUT11, TOUT20, and TOUT22 and the second detection signals TOUT10, TOUT21, TOUT01, and TOUT12. When the failure signal TEST_OUT has a logic high level, that is, when the first sum signal SUM1 or the second sum signal SUM2 has a logic high level, the external device may decide that a shortage occurs between the neighboring first through-electrodes TSV_G1 and the second through-electrodes TSV_G2.

Alternatively, when the fourth or sixth test mode begins, one among the first through-electrodes TSV_G1 and the second through-electrodes TSV_G2 of the target through-electrodes is discharged with the ground voltage VSS, while the other through-electrodes float. The failure detection circuit 310 may generate the failure signal TEST_OUT based on the first detection signals TOUT00, TOUT02, TOUT11, TOUT20, and TOUT22 and the second detection signals TOUT10, TOUT21, TOUT01, and TOUT12. When the failure signal TEST_OUT is at a logic high level, the external device may determine that a short occurs between the neighboring first through-electrodes TSV_G1 and the second through-electrodes TSV_G2.

Hereinafter, an OS test operation of the stacked memory device in accordance with an embodiment of the present invention will be described with reference to FIGS. 5A to 11.

Figure 12:
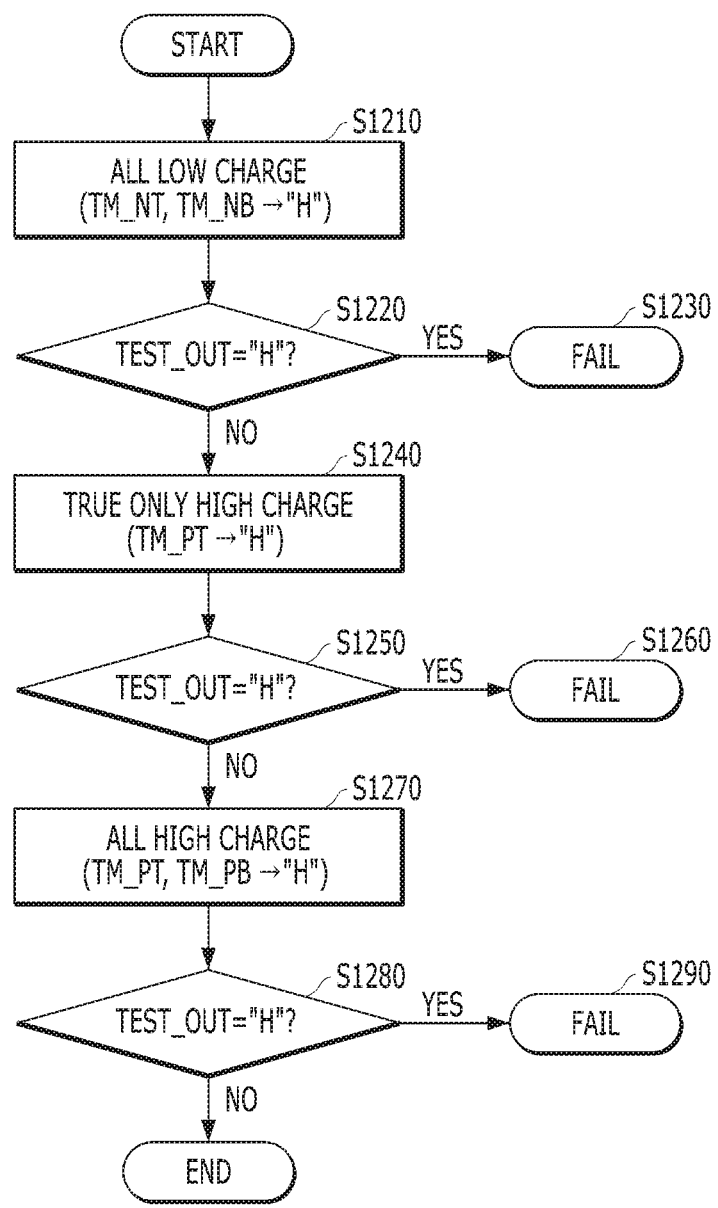
FIG. 12 is a flowchart illustrating an open and short (OS) test operation of a stacked memory device in accordance with the embodiment of the present invention.

FIG. 12 is a flowchart illustrating an open and short (OS) test operation of a stacked memory device in accordance with an embodiment of the present invention. Hereinafter, by way of example, a case of testing the target through-electrodes between the fourth core die 412_3 and the base die 414 of FIG. 11 will be described as an example. For reference, the target through-electrodes may include the first through-electrodes TSV_G1 and the second through-electrodes TSV_G2.

Referring to FIG. 12, first and second pull-down control signals TM_NT and TM_NB may be inputted at a logic high level "H" or "1", and each die may enter the second test mode (i.e., TM-2: ALL LOW CHARGE of FIG. 10). The test control circuit 330 of the fourth core die 412_3 may output all the first and second pull-down driving signals TM_OS_N1 and TM_OS_N2 at a logic high level "H". As a result, the pull-down drivers PD00 to PD22 of the fourth core die 412_3 may be turned on in order to discharge the target through-electrodes with the ground voltage VSS at step S1210.

The transfer gates TG00 to TG22 of the base die 414 may be simultaneously turned on based on the lower test signals TM_OSTEST and TM_OSTESTB. Further, the failure detection circuit 310 of the base die 414 may generate the first failure signal TEST_OUT based on the first detection signals TOUT00, TOUT02, TOUT11, TOUT20, and TOUT22 and the second detection signals TOUT10, TOUT21, TOUT01, and TOUT12. When the first failure signal TEST_OUT has a logic high level "H" ("YES" at step S1220), the external device may decide that a defect occurs in the vertically coupled through-electrodes (for example, a short failure occurring between the power source voltage VDD terminal and the through-electrodes, or an open failure occurring between the through-electrodes coupled in the vertical direction) at step S1230.

When the first failure signal TEST_OUT is a logic low level "L" ("NO" at the step S1220), only the first pull-up control signal TM_PT may be inputted at a logic high level "H", and each of the semiconductor chips may enter the third test mode (i.e., TM-3: TRUE ONLY HIGH CHARGE of FIG. 10). The test control circuit 330 of the fourth core die 412_3 may output only the first pull-up driving signal TM_OS_P1 at a logic high level "H". As a result, only the first pull-up drivers PU00 to PU22 of the fourth core die 412_3 may be turned on in order to charge only the first through-electrodes TSV_G1 with the test voltage VTEST, and the second through-electrodes TSV_G2 may float at step S1240.

The failure detection circuit 310 of the base die 414 may generate a second failure signal TEST_OUT based on the first detection signals TOUT00, TOUT02, TOUT11, TOUT20, and TOUT22 and the second detection signals TOUT10, TOUT21, TOUT01, and TOUT12. When the second failure signal TEST_OUT has a logic high level "H" ("YES" at step S1250), the external device may determine that a defect occurs between the neighboring through-electrodes (for example, a short failure between the first through-electrodes TSV_G1 and the second through-electrodes TSV_G2) at step S1260.

When the second failure signal TEST_OUT is at a logic low level "L" ("NO" at the step S1250), the first and second pull-up control signals TM_PT and TM_PB may be inputted at a logic high level "H" so that each of the semiconductor chips enters the first test mode. The test control circuit 330 of the fourth core die 412_3 may output the first and second pull-up driving signals TM_OS_P1 and TM_OS_P2 at a logic high level "H". As a result, the first and second pull-up drivers PU00 to PU22 of the fourth core dies 412_3 may be turned on in order to charge the target through-electrodes with the test voltage VTEST at step S1270.

The failure detection circuit 310 of the base die 414 may generate a third failure signal TEST_OUT based on the first detection signals TOUT00, TOUT02, TOUT11, TOUT20, and TOUT22 and the second detection signals TOUT10, TOUT21, TOUT01, and TOUT12. When the third failure signal TEST_OUT has a logic high level "H" ("YES" at step S1280), the external device may determine that a defect occurs in the vertically coupled through-electrodes (for example, a short failure between the terminal for the ground voltage VSS and the through-electrodes, or an open failure between the vertically coupled through-electrodes) at step 51290.

Meanwhile, the test operation is described in the above by taking a case of sequentially entering the second test mode→the third test mode→the first test mode as an example. However, the concept and spirit of the present invention are not limited thereto. The order of the second test mode and the first test mode may be changed, and the test operation may be performed in the fourth test mode instead of the third test mode.

As described above, the stacked semiconductor device in accordance with the embodiment of the present invention may easily and accurately determine whether the vertically connected through-electrodes are normally connected or not and whether the neighboring through-electrodes are shorted or not. Also, the test period may be reduced by testing multiple through-electrodes at one time.

Also, in accordance with the embodiments of the present invention, the stacked semiconductor device may easily and accurately decide whether the vertically coupled through-electrodes are normally coupled or not and whether the adjacent through-electrodes are shorted or not, thereby improving the reliability of the semiconductor device.

While the present invention has been described with respect to specific embodiments, it will be apparent to those skilled in the art that various changes and modifications may be made without departing from the spirit and scope of the invention as defined in the following claims.

For example, the logic gates and transistors illustrated in the above-described embodiments may be realized in different positions and types according to the polarity of input signals.

What is claimed is:

1. A stacked semiconductor device, comprising:
a plurality of semiconductor chips that are stacked in a vertical direction,
wherein each of the semiconductor chips includes:
a plurality of first through-electrodes;
a plurality of second through-electrodes positioned adjacent to the first through-electrodes;
a first voltage driving circuit suitable for charging or discharging the first through-electrodes based on a first driving control signal, while floating the second through-electrodes wherein at least one of the first through-electrodes to be charged or to be discharged comprises a target through-electrode to be tested and wherein a neighboring set of the second through-electrodes are positioned horizontally adjacent to and disposed around the target through-electrode;
a second voltage driving circuit suitable for charging or discharging the second through-electrodes based on a second driving control signal, while floating the first through-electrodes; and
a failure detection circuit suitable for generating a failure signal indicating a shortage between the first through-electrodes and the second through-electrodes, at least including a short between the target through-electrode and any of the neighboring set of the second through-electrodes positioned horizontally adjacent to and disposed around the target through-electrode with the neighboring set of the second through-electrodes floating during testing for the failure signal, based on a plurality of first detection signals received through the first through-electrodes and a plurality of second detection signals received through the second through-electrodes.

2. The stacked semiconductor device of claim 1, wherein the first through-electrodes include through-electrodes positioned at odd-numbered rows and odd-numbered columns, and through-electrodes positioned at even-numbered rows and even-numbered columns, and
wherein the second through-electrodes include through-electrodes positioned in the odd-numbered rows and the even-numbered columns, and through-electrodes positioned in the even-numbered rows and the odd-numbered columns.

3. The stacked semiconductor device of claim 1, wherein each of the semiconductor chips further includes:
a test control circuit suitable for, when an upper ID signal representing that the corresponding semiconductor chip is an upper chip is activated, generating the first driving control signal based on a first pull-up control signal and a first pull-down control signal and generating the second driving control signal based on a second pull-up control signal and a second pull-down control signal.

4. The stacked semiconductor device of claim 3,
wherein, when a level of the first pull-up control signal is different from a level of the second pull-up control signal in a state that a level of the first pull-down control signal is identical to a level of the second pull-down control signal, or the level of the first pull-down control signal is different from the level of the second pull-down in a state that the level of the first pull-up control signal is identical to the level of the second pull-up control signal,
wherein the failure signal includes a signal informing a shortage between the first through-electrodes and the second through-electrodes.

5. The stacked semiconductor device of claim 3, wherein the test control circuit includes:
a first test signal generation unit suitable for generating a preliminary test signal based on the first and second pull-up control signals or the first and second pull-down control signals;
a second test signal generation unit suitable for generating a lower test signal based on the preliminary test signal and a lower ID signal representing that the corresponding semiconductor chip is a lower chip;
an enable signal generation unit suitable for, when the upper ID signal is activated, generating a test enable signal that is activated according to a rising edge of the preliminary test signal and deactivated according to a falling edge of the preliminary test signal; and
a control signal generation unit suitable for, when the test enable signal is activated, generating the first driving control signal based on the first pull-up control signal and the first pull-down control signal, and generating the second driving control signal based on the second pull-up control signal and the second pull-down control signal.

6. The stacked semiconductor device of claim 5, wherein the enable signal generation unit includes:
a set signal generator suitable for generating a set signal in an initial section of an activation section of the preliminary test signal, when the upper ID signal is activated;
a reset signal generator suitable for generating a reset signal in an initial section of a deactivation section of the preliminary test signal; and
an SR latch suitable for generating the test enable signal that is activated based on the set signal and deactivated based on the reset signal.

7. The stacked semiconductor device of claim 5,
wherein the first driving control signal includes a first pull-up driving signal and a first pull-down driving signal, and
wherein the second driving control signal includes a second pull-up driving signal and a second pull-down driving signal.

8. The stacked semiconductor device of claim 7, wherein the control signal generation unit includes:
a first output component suitable for outputting, when the test enable signal is activated, the first pull-up control signal and the first pull-down control signal as the first pull-up driving signal and the first pull-down driving signal, and when the test enable signal is deactivated, fixing the first pull-up driving signal and the first pull-down driving signal at a predetermined level and outputting the same; and
a second output component suitable for outputting, when the test enable signal is activated, the second pull-up control signal and the second pull-down control signal as the second pull-up driving signal and the second pull-down driving signal, and when the test enable signal is deactivated, fixing the second pull-up driving signal and the second pull-down driving signal at a predetermined level and outputting the same.

9. The stacked semiconductor device of claim 7, wherein the first voltage driving circuit includes:
a plurality of first pull-up driving units that are coupled between a terminal for a power source voltage and the first through-electrodes and receive the first pull-up driving signal through a gate thereof; and
a plurality of first pull-down driving units that are coupled between the first through-electrodes and a terminal for a ground voltage and receive the first pull-down driving signal through a gate thereof.

10. The stacked semiconductor device of claim 7, wherein the second voltage driving circuit includes:
a plurality of second pull-up driving units that are coupled between a terminal for a power source voltage and the second through-electrodes and receive the second pull-up driving signal through a gate thereof; and
a plurality of second pull-down driving units that are coupled between the second through-electrodes and a terminal for a ground voltage and receive the second pull-down driving signal through a gate thereof.

11. The stacked semiconductor device of claim 5, wherein each of the semiconductor chips further includes:
a plurality of transfer gates suitable for outputting signals of the first through-electrodes as the first detection signals and outputting signals of the second through-electrodes as the second detection signals when the lower test signal is activated; and
a plurality of latch units suitable for latching the first detection signals and the second detection signals when the lower test signal is deactivated.

12. The stacked semiconductor device of claim 1, wherein the failure detection circuit includes:
a first logic unit suitable for performing a logic XOR operation onto the first detection signals;
a second logic unit suitable for performing a logic XOR operation onto the second detection signals; and
a third logic unit suitable for performing a logic OR operation onto an output of the first logic unit and an output of the second logic unit to generate the failure signal.

13. A stacked semiconductor device, comprising:
a plurality of semiconductor chips that are stacked in a vertical direction,
wherein each of the semiconductor chips includes:
a plurality of first through-electrodes;
a plurality of second through-electrodes positioned adjacent to the first through-electrodes;
a voltage driving circuit suitable for charging or discharging the first through-electrodes while floating the second through-electrodes, and charging or discharging the second through-electrodes while floating the first through-electrodes, wherein at least one of the first through-electrodes to be charged or to be discharged comprises a target through-electrode to be tested and wherein a neighboring set of the second through-electrodes are positioned horizontally adjacent to and disposed around the target through-electrode; and
a failure detection circuit suitable for generating a failure signal indicating a shortage between the first through-electrodes and the second through-electrodes, at least including a short between the target through-electrode and any of the neighboring set of the second through-electrodes positioned horizontally adjacent to and disposed around the target through-electrode with the neighboring set of the second through-electrodes floating during testing for the failure signal, based on first detection signals received through the first through-electrodes and second detection signals received through the second through-electrodes.

14. The stacked semiconductor device of claim 13,
wherein the first through-electrodes include through-electrodes positioned at odd-numbered rows and odd-numbered columns, and through-electrodes positioned at even-numbered rows and even-numbered columns, and
wherein the second through-electrodes include through-electrodes positioned in the odd-numbered rows and the even-numbered columns, and through-electrodes positioned in the even-numbered rows and the odd-numbered columns.

15. The stacked semiconductor device of claim 13,
wherein the failure detection circuit includes:
a first logic unit suitable for generating a first sum signal by detecting whether the first detection signals have the same logic level or not;
a second logic unit suitable for generating a second sum signal by detecting whether the second detection signals have the same logic level or not; and
a third logic unit suitable for generating the failure signal by performing a logic OR operation onto the first sum signal and the second sum signal.

* * * * *